(12) United States Patent
Raring et al.

(10) Patent No.: US 8,847,249 B2
(45) Date of Patent: *Sep. 30, 2014

(54) SOLID-STATE OPTICAL DEVICE HAVING ENHANCED INDIUM CONTENT IN ACTIVE REGIONS

(75) Inventors: James W. Raring, Goleta, CA (US); Daniel F. Feezell, Goleta, CA (US); Shuji Nakamura, Goleta, CA (US)

(73) Assignee: Soraa, Inc., Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/484,924

(22) Filed: Jun. 15, 2009

(65) Prior Publication Data

US 2009/0309110 A1 Dec. 17, 2009

Related U.S. Application Data

(60) Provisional application No. 61/061,980, filed on Jun. 16, 2008.

(51) Int. Cl.
| | |
|---|---|
| *H01L 29/20* | (2006.01) |
| *H01L 33/00* | (2010.01) |
| *H01L 33/08* | (2010.01) |
| *H01L 33/16* | (2010.01) |
| *H01L 21/02* | (2006.01) |
| *H01L 33/06* | (2010.01) |

(52) U.S. Cl.
CPC .............. *H01L 33/0075* (2013.01); *H01L 33/16* (2013.01); *H01L 21/02639* (2013.01); *H01L 33/08* (2013.01); *H01L 21/0254* (2013.01); *H01L 33/06* (2013.01); *H01L 21/0262* (2013.01)
USPC .................................... 257/89; 257/E33.013

(58) Field of Classification Search
CPC ............ H01S 301/173; H01S 2304/12; H01S 5/2201; H01S 5/3202; H01S 5/343; H01S 5/3436; H01L 21/0254; H01L 21/02458; H01L 21/0262; H01L 21/0242; H01L 21/02639; H01L 21/02647; H01L 21/02433; H01L 21/0237; H01L 33/06
USPC .............. 257/89, E33.005, E33.015; 438/478
See application file for complete search history.

(56) References Cited

U.S. PATENT DOCUMENTS

| | | | |
|---|---|---|---|
| 4,318,058 A | 3/1982 | Mito et al. | |
| 4,341,592 A | 7/1982 | Shortes et al. | |

(Continued)

FOREIGN PATENT DOCUMENTS

| | | |
|---|---|---|
| CN | 101009347 | 3/1987 |
| CN | 1538534 | 10/2004 |

(Continued)

OTHER PUBLICATIONS

Aoki et al., "InGaAs/InGaAsP MQW Electroabsorption Modulator Integrated with a DFB Laser Fabricated by Band-Gap Energy Control Selective Area MOCVD, 1993, "IEEE J Quantum Electronics, vol. 29, pp. 2088-2096.

(Continued)

*Primary Examiner* — Duy T Nguyen

(74) *Attorney, Agent, or Firm* — Kilpatrick Townsend & Stockton LLP

(57) ABSTRACT

A multicolored LED device made of a semipolar material having different indium containing regions provided on different spatial features of GaN material. Other materials such as non-polar materials can also be used.

21 Claims, 7 Drawing Sheets

(56) References Cited

U.S. PATENT DOCUMENTS

| | | |
|---|---|---|
| 4,860,687 A | 8/1989 | Frijlink |
| 4,911,102 A | 3/1990 | Manabe et al. |
| 5,331,654 A | 7/1994 | Jewell et al. |
| 5,334,277 A | 8/1994 | Nakamura |
| 5,366,953 A | 11/1994 | Char et al. |
| 5,527,417 A | 6/1996 | Iida et al. |
| 5,607,899 A | 3/1997 | Yoshida et al. |
| 5,632,812 A | 5/1997 | Hirabayashi |
| 5,647,945 A | 7/1997 | Matsuse et al. |
| 5,663,592 A | 9/1997 | Miyazawa et al. |
| 5,696,389 A | 12/1997 | Ishikawa et al. |
| 5,698,880 A | 12/1997 | Takahashi et al. |
| 5,736,753 A | 4/1998 | Ohno et al. |
| 5,821,555 A | 10/1998 | Saito et al. |
| 5,864,171 A | 1/1999 | Yamamoto et al. |
| 5,888,907 A | 3/1999 | Tomoyasu et al. |
| 5,926,493 A | 7/1999 | O'Brien et al. |
| 5,951,923 A | 9/1999 | Horie et al. |
| 6,069,394 A | 5/2000 | Hashimoto et al. |
| 6,072,197 A | 6/2000 | Horino et al. |
| 6,123,768 A | 9/2000 | Moustakas |
| 6,147,953 A | 11/2000 | Duncan |
| 6,153,010 A * | 11/2000 | Kiyoku et al. ............... 117/95 |
| 6,195,381 B1 | 2/2001 | Botez et al. |
| 6,239,454 B1 | 5/2001 | Glew et al. |
| 6,379,985 B1 | 4/2002 | Cervantes et al. |
| 6,451,157 B1 | 9/2002 | Hubacek |
| 6,489,636 B1 | 12/2002 | Goetz et al. |
| 6,586,762 B2 | 7/2003 | Kozaki |
| 6,635,904 B2 | 10/2003 | Goetz et al. |
| 6,639,925 B2 | 10/2003 | Niwa et al. |
| 6,680,959 B2 | 1/2004 | Tanabe et al. |
| 6,734,461 B1 | 5/2004 | Shiomi et al. |
| 6,755,932 B2 | 6/2004 | Masuda et al. |
| 6,809,781 B2 | 10/2004 | Setlur et al. |
| 6,814,811 B2 | 11/2004 | Ose |
| 6,833,564 B2 | 12/2004 | Shen et al. |
| 6,858,081 B2 | 2/2005 | Biwa et al. |
| 6,858,882 B2 | 2/2005 | Tsuda et al. |
| 6,875,273 B2 | 4/2005 | Katamine et al. |
| 6,920,166 B2 | 7/2005 | Akasaka et al. |
| 7,009,199 B2 | 3/2006 | Hall |
| 7,019,325 B2 | 3/2006 | Li et al. |
| 7,033,858 B2 | 4/2006 | Chai et al. |
| 7,053,413 B2 | 5/2006 | D'Evelyn et al. |
| 7,063,741 B2 | 6/2006 | D'Evelyn et al. |
| 7,128,849 B2 | 10/2006 | Setlur et al. |
| 7,135,348 B2 * | 11/2006 | Okuyama et al. ............ 438/47 |
| 7,220,324 B2 | 5/2007 | Baker et al. |
| 7,303,630 B2 | 12/2007 | Motoki et al. |
| 7,312,156 B2 | 12/2007 | Granneman et al. |
| 7,323,723 B2 | 1/2008 | Ohtsuka et al. |
| 7,338,828 B2 | 3/2008 | Imer et al. |
| 7,358,542 B2 | 4/2008 | Radkov et al. |
| 7,358,543 B2 | 4/2008 | Chua et al. |
| 7,390,359 B2 | 6/2008 | Miyanaga et al. |
| 7,470,555 B2 | 12/2008 | Matsumura |
| 7,483,466 B2 | 1/2009 | Uchida et al. |
| 7,483,468 B2 | 1/2009 | Tanaka |
| 7,489,441 B2 | 2/2009 | Scheible et al. |
| 7,491,984 B2 | 2/2009 | Koike et al. |
| 7,555,025 B2 | 6/2009 | Yoshida |
| 7,598,104 B2 | 10/2009 | Teng et al. |
| 7,691,658 B2 | 4/2010 | Kaeding et al. |
| 7,709,284 B2 | 5/2010 | Iza et al. |
| 7,727,332 B2 | 6/2010 | Habel et al. |
| 7,733,571 B1 | 6/2010 | Li |
| 7,749,326 B2 | 7/2010 | Kim et al. |
| 7,806,078 B2 | 10/2010 | Yoshida |
| 7,858,408 B2 | 12/2010 | Mueller et al. |
| 7,862,761 B2 | 1/2011 | Okushima et al. |
| 7,923,741 B1 | 4/2011 | Zhai et al. |
| 7,939,354 B2 | 5/2011 | Kyono et al. |
| 7,968,864 B2 | 6/2011 | Akita et al. |
| 8,017,932 B2 | 9/2011 | Okamoto et al. |
| 8,044,412 B2 | 10/2011 | Murphy et al. |
| 8,124,996 B2 | 2/2012 | Raring et al. |
| 8,126,024 B1 | 2/2012 | Raring |
| 8,143,148 B1 | 3/2012 | Raring et al. |
| 8,242,522 B1 | 8/2012 | Raring |
| 8,247,887 B1 | 8/2012 | Raring et al. |
| 8,252,662 B1 | 8/2012 | Poblenz et al. |
| 8,254,425 B1 | 8/2012 | Raring |
| 8,259,769 B1 | 9/2012 | Raring et al. |
| 8,284,810 B1 | 10/2012 | Sharma et al. |
| 8,294,179 B1 | 10/2012 | Raring |
| 8,314,429 B1 | 11/2012 | Raring et al. |
| 8,350,273 B2 | 1/2013 | Vielemeyer |
| 8,351,478 B2 | 1/2013 | Raring et al. |
| 8,355,418 B2 | 1/2013 | Raring et al. |
| 8,416,825 B1 | 4/2013 | Raring |
| 8,422,525 B1 | 4/2013 | Raring et al. |
| 8,427,590 B2 | 4/2013 | Raring et al. |
| 8,451,876 B1 | 5/2013 | Raring et al. |
| 2001/0048114 A1 | 12/2001 | Morita et al. |
| 2002/0027933 A1 | 3/2002 | Tanabe et al. |
| 2002/0050488 A1 | 5/2002 | Nikitin et al. |
| 2002/0085603 A1 | 7/2002 | Okumura |
| 2002/0105986 A1 | 8/2002 | Yamasaki |
| 2002/0171092 A1 | 11/2002 | Goetz et al. |
| 2003/0000453 A1 | 1/2003 | Unno et al. |
| 2003/0001238 A1 | 1/2003 | Ban |
| 2003/0012243 A1 | 1/2003 | Okumura |
| 2003/0020087 A1 | 1/2003 | Goto et al. |
| 2003/0129810 A1 | 7/2003 | Barth et al. |
| 2003/0140846 A1 * | 7/2003 | Biwa et al. ............... 117/89 |
| 2003/0178617 A1 | 9/2003 | Appenzeller et al. |
| 2003/0200931 A1 | 10/2003 | Goodwin |
| 2003/0216011 A1 | 11/2003 | Nakamura et al. |
| 2004/0025787 A1 | 2/2004 | Selbrede et al. |
| 2004/0060518 A1 | 4/2004 | Nakamura et al. |
| 2004/0099213 A1 | 5/2004 | Adomaitis et al. |
| 2004/0104391 A1 | 6/2004 | Maeda et al. |
| 2004/0146264 A1 | 7/2004 | Auner et al. |
| 2004/0151222 A1 | 8/2004 | Sekine |
| 2004/0196877 A1 | 10/2004 | Kawakami et al. |
| 2004/0222357 A1 | 11/2004 | King et al. |
| 2004/0233950 A1 | 11/2004 | Furukawa et al. |
| 2004/0247275 A1 | 12/2004 | Vakhshoori et al. |
| 2004/0262624 A1 | 12/2004 | Akita et al. |
| 2005/0040384 A1 | 2/2005 | Tanaka et al. |
| 2005/0072986 A1 | 4/2005 | Sasaoka |
| 2005/0095861 A1 | 5/2005 | Ueno et al. |
| 2005/0168564 A1 | 8/2005 | Kawaguchi et al. |
| 2005/0214992 A1 | 9/2005 | Chakraborty et al. |
| 2005/0218413 A1 | 10/2005 | Matsumoto et al. |
| 2005/0218780 A1 | 10/2005 | Chen |
| 2005/0224826 A1 | 10/2005 | Keuper et al. |
| 2005/0229855 A1 | 10/2005 | Raaijmakers |
| 2005/0230701 A1 | 10/2005 | Huang |
| 2005/0245095 A1 | 11/2005 | Haskell et al. |
| 2005/0247260 A1 | 11/2005 | Shin et al. |
| 2005/0285128 A1 | 12/2005 | Scherer et al. |
| 2005/0286591 A1 | 12/2005 | Lee |
| 2006/0030738 A1 | 2/2006 | Vanmaele et al. |
| 2006/0033009 A1 | 2/2006 | Kobayashi et al. |
| 2006/0037529 A1 | 2/2006 | D'Evelyn et al. |
| 2006/0038193 A1 | 2/2006 | Wu et al. |
| 2006/0060131 A1 | 3/2006 | Atanackovic |
| 2006/0060833 A1 * | 3/2006 | Bruckner et al. ............. 257/13 |
| 2006/0066319 A1 | 3/2006 | Dallenbach et al. |
| 2006/0077795 A1 | 4/2006 | Kitahara et al. |
| 2006/0078022 A1 | 4/2006 | Kozaki et al. |
| 2006/0079082 A1 | 4/2006 | Bruhns et al. |
| 2006/0086319 A1 | 4/2006 | Kasai et al. |
| 2006/0118799 A1 | 6/2006 | D'Evelyn et al. |
| 2006/0126688 A1 | 6/2006 | Kneissl |
| 2006/0144334 A1 | 7/2006 | Yim et al. |
| 2006/0175624 A1 | 8/2006 | Sharma et al. |
| 2006/0189098 A1 | 8/2006 | Edmond |
| 2006/0193359 A1 | 8/2006 | Kuramoto |
| 2006/0205199 A1 | 9/2006 | Baker et al. |
| 2006/0213429 A1 | 9/2006 | Motoki et al. |
| 2006/0216416 A1 | 9/2006 | Sumakeris et al. |

(56) References Cited

U.S. PATENT DOCUMENTS

| | | |
|---|---|---|
| 2006/0256482 A1 | 11/2006 | Araki et al. |
| 2006/0288928 A1 | 12/2006 | Eom et al. |
| 2007/0081857 A1 | 4/2007 | Yoon |
| 2007/0086916 A1 | 4/2007 | LeBoeuf et al. |
| 2007/0093073 A1 | 4/2007 | Farrell et al. |
| 2007/0101932 A1 | 5/2007 | Schowalter et al. |
| 2007/0110112 A1 | 5/2007 | Sugiura |
| 2007/0111488 A1 | 5/2007 | Chakraborty et al. |
| 2007/0120141 A1 | 5/2007 | Moustakas et al. |
| 2007/0153866 A1 | 7/2007 | Shchegrov et al. |
| 2007/0163490 A1 | 7/2007 | Habel et al. |
| 2007/0166853 A1 | 7/2007 | Guenther et al. |
| 2007/0184637 A1 | 8/2007 | Haskell et al. |
| 2007/0217462 A1 | 9/2007 | Yamasaki |
| 2007/0242716 A1 | 10/2007 | Samal et al. |
| 2007/0252164 A1 | 11/2007 | Zhong et al. |
| 2007/0259464 A1 | 11/2007 | Bour et al. |
| 2007/0272933 A1 | 11/2007 | Kim et al. |
| 2007/0280320 A1 | 12/2007 | Feezell et al. |
| 2008/0001174 A1 | 1/2008 | Shibata |
| 2008/0029152 A1 | 2/2008 | Milshtein et al. |
| 2008/0087919 A1 | 4/2008 | Tysoe et al. |
| 2008/0092812 A1 | 4/2008 | McDiarmid et al. |
| 2008/0095492 A1 | 4/2008 | Son et al. |
| 2008/0121916 A1 | 5/2008 | Teng et al. |
| 2008/0124817 A1 | 5/2008 | Bour et al. |
| 2008/0149949 A1 | 6/2008 | Nakamura et al. |
| 2008/0149959 A1 | 6/2008 | Nakamura et al. |
| 2008/0164578 A1 | 7/2008 | Tanikella et al. |
| 2008/0173735 A1 | 7/2008 | Mitrovic et al. |
| 2008/0191192 A1 | 8/2008 | Feezell et al. |
| 2008/0191223 A1 | 8/2008 | Nakamura et al. |
| 2008/0198881 A1 | 8/2008 | Farrell et al. |
| 2008/0210958 A1 | 9/2008 | Senda et al. |
| 2008/0217745 A1 | 9/2008 | Miyanaga et al. |
| 2008/0232416 A1 | 9/2008 | Okamoto et al. |
| 2008/0251020 A1 | 10/2008 | Franken et al. |
| 2008/0257256 A1 | 10/2008 | Melnik et al. |
| 2008/0283851 A1 | 11/2008 | Akita |
| 2008/0285609 A1 | 11/2008 | Ohta et al. |
| 2008/0291961 A1 | 11/2008 | Kamikawa et al. |
| 2008/0298409 A1 | 12/2008 | Yamashita et al. |
| 2008/0303033 A1 | 12/2008 | Brandes |
| 2008/0308815 A1 | 12/2008 | Kasai et al. |
| 2008/0315179 A1 | 12/2008 | Kim et al. |
| 2009/0021723 A1 | 1/2009 | De Lega |
| 2009/0058532 A1 | 3/2009 | Kikkawa et al. |
| 2009/0066241 A1 | 3/2009 | Yokoyama |
| 2009/0078944 A1 | 3/2009 | Kubota et al. |
| 2009/0080857 A1 | 3/2009 | St. John-Larkin |
| 2009/0081857 A1 | 3/2009 | Hanser et al. |
| 2009/0081867 A1 | 3/2009 | Taguchi et al. |
| 2009/0141765 A1 | 6/2009 | Kohda et al. |
| 2009/0153752 A1 | 6/2009 | Silverstein |
| 2009/0159869 A1* | 6/2009 | Ponce et al. .................. 257/13 |
| 2009/0229519 A1 | 9/2009 | Saitoh |
| 2009/0250686 A1 | 10/2009 | Sato et al. |
| 2009/0267100 A1 | 10/2009 | Miyake et al. |
| 2009/0273005 A1 | 11/2009 | Lin |
| 2009/0301387 A1 | 12/2009 | D'Evelyn |
| 2009/0301388 A1 | 12/2009 | D'Evelyn |
| 2009/0309110 A1 | 12/2009 | Raring et al. |
| 2009/0309127 A1 | 12/2009 | Raring et al. |
| 2009/0310640 A1 | 12/2009 | Sato et al. |
| 2009/0316116 A1 | 12/2009 | Melville et al. |
| 2009/0320744 A1 | 12/2009 | D'Evelyn |
| 2009/0321778 A1 | 12/2009 | Chen et al. |
| 2010/0001300 A1 | 1/2010 | Raring et al. |
| 2010/0003492 A1 | 1/2010 | D'Evelyn |
| 2010/0006546 A1 | 1/2010 | Young et al. |
| 2010/0006873 A1 | 1/2010 | Raring et al. |
| 2010/0025656 A1 | 2/2010 | Raring et al. |
| 2010/0031875 A1 | 2/2010 | D'Evelyn |
| 2010/0032644 A1 | 2/2010 | Akita et al. |
| 2010/0044718 A1 | 2/2010 | Hanser et al. |
| 2010/0096615 A1 | 4/2010 | Okamoto et al. |
| 2010/0104495 A1 | 4/2010 | Kawabata et al. |
| 2010/0140630 A1 | 6/2010 | Hamaguchi et al. |
| 2010/0140745 A1* | 6/2010 | Khan et al. .................. 257/615 |
| 2010/0151194 A1 | 6/2010 | D'Evelyn |
| 2010/0187540 A1 | 7/2010 | Ishibashi et al. |
| 2010/0195687 A1 | 8/2010 | Okamoto et al. |
| 2010/0220262 A1 | 9/2010 | DeMille et al. |
| 2010/0276663 A1 | 11/2010 | Enya et al. |
| 2010/0295054 A1 | 11/2010 | Okamoto et al. |
| 2010/0295088 A1 | 11/2010 | D'Evelyn et al. |
| 2010/0302464 A1 | 12/2010 | Raring et al. |
| 2010/0309943 A1 | 12/2010 | Chakraborty et al. |
| 2010/0316075 A1 | 12/2010 | Raring et al. |
| 2010/0327291 A1 | 12/2010 | Preble et al. |
| 2011/0031508 A1 | 2/2011 | Hamaguchi et al. |
| 2011/0056429 A1 | 3/2011 | Raring et al. |
| 2011/0057167 A1 | 3/2011 | Ueno et al. |
| 2011/0064100 A1 | 3/2011 | Raring et al. |
| 2011/0064101 A1 | 3/2011 | Raring et al. |
| 2011/0064102 A1 | 3/2011 | Raring et al. |
| 2011/0073888 A1 | 3/2011 | Ueno et al. |
| 2011/0075694 A1 | 3/2011 | Yoshizumi et al. |
| 2011/0103418 A1 | 5/2011 | Hardy et al. |
| 2011/0129669 A1 | 6/2011 | Fujito et al. |
| 2011/0150020 A1 | 6/2011 | Haase et al. |
| 2011/0164637 A1 | 7/2011 | Yoshizumi et al. |
| 2011/0180781 A1 | 7/2011 | Raring et al. |
| 2011/0182056 A1 | 7/2011 | Trottier et al. |
| 2011/0186874 A1 | 8/2011 | Shum |
| 2011/0186887 A1 | 8/2011 | Trottier et al. |
| 2011/0188530 A1 | 8/2011 | Lell et al. |
| 2011/0216795 A1 | 9/2011 | Hsu et al. |
| 2011/0247556 A1 | 10/2011 | Raring et al. |
| 2011/0281422 A1 | 11/2011 | Wang et al. |
| 2011/0286484 A1 | 11/2011 | Raring et al. |
| 2012/0104359 A1 | 5/2012 | Felker et al. |
| 2012/0178198 A1 | 7/2012 | Raring et al. |
| 2012/0187371 A1 | 7/2012 | Raring et al. |
| 2012/0314398 A1 | 12/2012 | Raring et al. |
| 2013/0016750 A1 | 1/2013 | Raring et al. |
| 2013/0022064 A1 | 1/2013 | Raring et al. |
| 2013/0044782 A1 | 2/2013 | Raring |
| 2013/0064261 A1 | 3/2013 | Sharma et al. |
| 2013/0075770 A1 | 3/2013 | Chakraborty et al. |

FOREIGN PATENT DOCUMENTS

| | | |
|---|---|---|
| CN | 1702836 | 11/2005 |
| CN | 1851942 | 10/2006 |
| CN | 101079463 | 11/2007 |
| CN | 101099245 | 1/2008 |
| CN | 101171692 | 4/2008 |
| JP | 3-287770 | 12/1991 |
| JP | 2006-066869 | 3/2006 |
| JP | 2006-093683 | 4/2006 |
| JP | 2006-156958 | 6/2006 |
| JP | 2007-173467 A | 7/2007 |
| JP | 2007-068398 | 4/2008 |
| JP | 2010-219490 | 9/2010 |
| WO | WO2008-041521 | 4/2008 |
| WO | WO 2010/120819 | 10/2010 |

OTHER PUBLICATIONS

Asano et al., "100-mW kink-Free Blue-Violet Laser Diodes with Low Aspect Ratio," 2003, IEEE Journal of Quantum Electronics, vol. 39, No. 1, pp. 135-140.

Bernardini et al., "Spontaneous Polarization and Piezoelectric Constants of III-V Nitrides," 1997, Physical Review B, vol. 56, No. 16, pp. 10024-10027.

Caneau et al., "Studies on Selective OVMPE of (Ga,In)/(As,P)," 1992, Journal of Crystal Growth, vol. 124, pp. 243-248.

Chen et al., "Growth and Optical Properties of Highly Uniform and Periodic InGaN Nanostructures," 2007, Advanced Materials, vol. 19, pp. 1707-1710.

(56) References Cited

OTHER PUBLICATIONS

Funato et al., "Blue, Green, and Amber InGaN/GaN Light-Emitting Diodes on Semipolar (1122) GaN Substrates," 2006, Journal of Japanese Applied Physics, vol. 45, No. 26, pp. L659-L662.
Funato et al., "Monolithic Polychromatic Light-Emitting Diodes Based on InGaN Microfacet Quantum Wells toward Tailor-Made Solid-State Lighting," 2008, Applied Physics Express, vol. 1, pp. 011106-1-011106-3.
Hap ://techon.nikkeibp. co jp/english/NEWS_EN/20080122/146009.
Kuramoto et al., "Novel Ridge-Type InGaN Multiple-Quantum-Well Laser Diodes Fabricated by Selective Area Re-Growth on n-GaN Substrates," 2007, Journal of Japanese Applied Physics, vol. 40, pp. 925-927.
Nam et al., "Later Epitaxial Overgrowth of GaN films on SiO2 Areas Via Metalorganic Vapor Phase Epitaxy," 1998, Journal of Electronic Materials, vol. 27, No. 4, pp. 233-237.
Nakamura et al., "InGaN/Gan/AlGaN-based Laser Diodes with Modulation-doped Strained-layer Superlattices Grown on an Epitaxially Laterally Grown GaN Substrate", 1998, Applied Physics Letters, vol. 72, No. 12, pp. 211-213.
Okamoto et al., "Pure Blue Laser Diodes Based on Nonpolar m-Plane Gallium Nitride with InGaN Waveguiding Layers," 2007, Journal of Japanese Applied Physics, vol. 46, No. 35, pp. 820-822.
Sato et al., "High Power and High Efficiency Green Light Emitting Diode on Free-Standing Semipolar (1122) Bulk GaN Substrate," 2007, Physica Status Solidi (RRL), vol. 1, pp. 162-164.
Schmidt et al., "Demonstration of Nonpolar m-plane InGaN/GaN Laser Diodes," 2007, Journal of Japanese Applied Physics, vol. 46, No. 9, pp. 190-191.
Uchida et al.,"Recent Progress in High-Power Blue-violet Lasers," 2003, IEEE Journal of Selected Topics in Quantum Electronics, vol. 9, No. 5, pp. 1252-1259.
Waltereit et al., "Nitride Semiconductors Free of Electrostatic Fields for Efficient White Light-emitting Diodes," 2000, Nature: International Weekly Journal of Science, vol. 406, pp. 865-868.
Yu et al., "Multiple Wavelength Emission from Semipolar InGaN/GaN Quantum Wells Selectively Grown by MOCVD," in Conference on Lasers and Electro-Optics/Quantum Electronics and Laser Science Conference and Photonic Applications Systems Technologies, OSA Technical Digest (CD) (Optical Society of America, 2007), paper JTuA92.
U.S. Appl. No. 12/497,289, unpublished, filed Jul. 2, 2009, Raring et al.
D'Evelyn et al., "Bulk GaN Crystal Growth by the High-Pressure Ammonothermal Method," Journal of Crystal Growth, 2007, vol. 300, pp. 11-16.
Fujii et al., "Increase in the Extraction Efficiency of GaN-based Light-Emitting Diodes Via Surface Roughening," 2004, Applied Physics Letters, vol. 84, No. 6, pp. 855-857.
Gardner et al. "Blue-emitting InGaN-GaN double-heterostructure light-emitting diodes reaching maximum quantum efficiency above 200 A/ cm2", Applied Physics Letters 91, 243506 (2007).
Hiramatsu et al., Selective Area Growth and Epitaxial Lateral Overgrowth of GaN by Metalorganic Vapor Phase Epitaxy and Hydride Vapor Phase Epitaxy. Materials Science and Engineering B, vol. 59, May 6, 1999. pp. 104-111.
Iso et al., "High Brightness Blue InGaN/GaN Light Emitting Diode on Nonpolar m-plane Bulk GaN Substrate," 2007, Japanese Journal of Applied Physics, vol. 46, No. 40, pp. L960-L962.
Kendall et al., "Energy Savings Potential of Solid State Lighting in General Lighting Applications," 2001, Report for the Department of Energy, pp. 1-35.
Kim et al, "Improved Electroluminescence on Nonpolar m-plane InGaN/GaN Qantum Well LEDs", 2007, Physica Status Solidi (RRL), vol. 1, No. 3, pp. 125-127.
Masui et al. "Electrical Characteristics of Nonpolar InGaN-Based Light-Emitting Diodes Evaluated at Low Temperature," Jpn. J. Appl. Phys. 46 pp. 7309-7310 (2007).
Michiue et al. "Recent development of nitride LEDs and LDs," Proceedings of SPIE, vol. 7216, 72161Z (2009).
Okamoto et. al "Continuous-Wave Operation of m-Plane InGaN Multiple Quantum Well Laser Diodes" The Japan Society of I Applied Physics JJAP Express LEtter, vol. 46, No. 9, 2007 pp. L 187-L 189.
Purvis, "Changing the Crystal Face of Gallium Nitride." The Advance Semiconductor Magazine, vol. 18, No. 8, Nov. 2005.
Sato et al., "Optical Properties of Yellow Light-Emitting-Diodes Grown on Semipolar (1122) Bulk GaN Substrate," 2008, Applied Physics Letter, vol. 92, No. 22, pp. 221110-1-221110-3.
Schmidt et al., "High Power and High External Efficiency m-plane InGaN Light Emitting Diodes," 2007, Japanese Journal of Applied Physics, vol. 46, No. 7, pp. L126-L128.
Shchekin et al., "High Performance Thin-film Flip-Chip InGaN-GaN Light-emitting Diodes," 2006, Applied Physics Letters, vol. 89, pp. 071109-071109-3.
Shen et al. "Auger recombination in InGaN measured by photoluminescence," Applied Physics Letters, 91, 141101 (2007).
Sizov et al., "500-nm Optical Gain Anisotropy of Semipolar (1122) InGaN Quantum Wells," 2009, Applied Physics Express, vol. 2, pp. 071001-1-071001-3.
Tomiya et. al. Dislocation related issues in the degradation of GaN-based laser diodes, IEEE Journal of Selected Topics in Quantum Electronics vol. 10, No. 6 (2004).
Tyagi et al., "High Brightness Violet InGaN/GaN Light Emitting Diodes on Semipolar (1011) Bulk GaN Substrates," 2007, Japanese Journal of Applied Physics, vol. 46, No. 7, pp. L129-L131.
Wierer et al., "High-power AlGaInN Flip-chip Light-emitting Diodes," 2001, Applied Physics Letters, vol. 78, No. 22, pp. 3379-3381.
Yamaguchi, A. Atsushi, "Anisotropic Optical Matrix Elements in Strained GaN-quantum Wells with Various Substrate Orientations," 2008, Physica Status Solidi (PSS), vol. 5, No. 6, pp. 2329-2332.
Zhong et al., "Demonstration of High Power Blue-Green Light Emitting Diode on Semipolar (1122) Bulk GaN Substrate," 2007, Electron Letter, vol. 43, No. 15, pp. 825-826.
Zhong et al., "High Power and High Efficiency Blue Light Emitting Diode on Freestanding Semipolar (1122) Bulk GaN Substrate," 2007, Applied Physics Letter, vol. 90, No. 23, pp. 233504-233504-3.
USPTO Notice of Allowance for U.S. Appl. No. 12/502,058 dated Jul. 19, 2012.
USPTO Office Action for U.S. Appl. No. 12/749,466 dated Jul. 3, 2012.
USPTO Notice of Allowance for U.S. Appl. No. 12/749,476 dated Jun. 26, 2012.
USPTO Office Action for U.S. Appl. No. 12/759,273 dated Jun. 26, 2012.
USPTO Notice of Allowance for U.S. Appl. No. 12/762,271 dated Aug. 8, 2012.
USPTO Notice of Allowance for U.S. Appl. No. 12/880,803 dated Jul. 18, 2012.
USPTO Office Action for U.S. Appl. No. 12/883,093 dated Aug. 3, 2012.
USPTO Office Action for U.S. Appl. No. 12/884,993 dated Aug. 2, 2012.
USPTO Office Action for U.S. Appl. No. 12/995,946 dated Mar. 28, 2012.
USPTO Office Action for U.S. Appl. No. 13/046,565 dated Jul. 19, 2012.
International Search Report of PCT Application No. PCT/US2009/047107, dated Sep. 29, 2009, 4 pages total.
International Search Report of PCT Application No. PCT/US2009/046786, dated May 13, 2010, 2 pages total.
International Search Report of PCT Application No. PCT/US2009/52611, dated Sep. 29, 2009, 3 pages total.
International Search Report & Written Opinion of PCT Application No. PCT/US2010/030939, dated Jun. 16, 2010, 9 pages total.
International Search Report & Written Opinion of PCT Application No. PCT/US2010/049172, dated Nov. 17, 2010, 7 pages total.
International Search Report of PCT Application No. PCT/US2011/037792, dated Sep. 8, 2011, 2 pages total.

(56) References Cited

OTHER PUBLICATIONS

Yoshizumi et al., 'Continuous-Wave Operation of 520 nm Green InGaN-Based Laser Diodes on Semi-Polar {2021} GaN Substrates,' Applied Physics Express, vol. 2, 2009, pp. 092101-1-092101-3.
USPTO Office Action for U.S. Appl. No. 12/484,924 dated Oct. 31, 2011.
Chinese Office Action From Chinese Patent Application No. 200980134723.8 dated Nov. 1, 2012, 22 pgs. (With Translation).
Franssila, 'Tools for CVD and Epitaxy', Introduction to Microfabrication, 2004, pp. 329-336.
USPTO Office Action for U.S. Appl. No. 12/789,303 dated Sep. 24, 2012.
USPTO Office Action for U.S. Appl. No. 12/859,153 dated Sep. 25, 2012.
USPTO Notice of Allowance for U.S. Appl. No. 12/883,093 dated Nov. 21, 2012.
USPTO Notice of Allowance for U.S. Appl. No. 12/884,993 dated Nov. 26, 2012.
USPTO Office Action for U.S. Appl. No. 13/354,639 dated Nov. 7, 2012.
USPTO Notice of Allowance for U.S. Appl. No. 13/354,639 dated Dec. 14, 2012.
Adesida et al., 'Characteristics of chemically assisted ion beam etching of gallium nitride', Applied Physics Letters, vol. 65, No. 7, 1994, pp. 889-891.
Behfar et al., 'Progress in Etched Facet Technology for GaN and Blue Lasers', Proc. of SPIE., vol. 6473, 64731F, 2007, pp. 1-8.
International Preliminary Report & Written Opinion of PCT Application No. PCT/US2011/060030 dated Mar. 21, 2012, 11 pgs. total.
USPTO Office Action for U.S. Appl. No. 12/727,148 dated May 15, 2013.
USPTO Notice of Allowance for U.S. Appl. No. 12/749,466 dated Jan. 2, 2013.
USPTO Office Action for U.S. Appl. No. 12/787,343 dated Dec. 17, 2012.
USPTO Notice of Allowance for U.S. Appl. No. 12/787,343 dated Jun. 10, 2013.
USPTO Notice of Allowance for U.S. Appl. No. 12/789,303 dated Dec. 21, 2012.
USPTO Office Action for U.S. Appl. No. 12/868,441 dated Dec. 18, 2012.
USPTO Office Action for U.S. Appl. No. 13/114,806 dated Apr. 12, 2013.
USPTO Office Action for U.S. Appl. No. 13/291,922 dated Jun. 18, 2013.
USPTO Office Action for U.S. Appl. No. 13/548,635 dated Jun. 14, 2013.
USPTO Notice of Allowance for U.S. Appl. No. 13/606,894 dated May 24, 2013.
Founta et al., 'Anisotropic Morphology of Nonpolar a-Plane GaN Quantum Dots and Quantum Wells,' Journal of Applied Physics, vol. 102, 2007, pp. 074304-1-074304-6.
USPTO Office Action for U.S. Appl. No. 12/481,543 dated Jun. 27, 2011.
USPTO Office Action for U.S. Appl. No. 12/482,440 dated Feb. 23, 2011.
USPTO Office Action for U.S. Appl. No. 12/482,440 dated Aug. 12, 2011.
USPTO Office Action for U.S. Appl. No. 12/491,169 dated Oct. 22, 2010.
USPTO Office Action for U.S. Appl. No. 12/491,169 dated May 11, 2011.
USPTO Notice of Allowance for U.S. Appl. No. 12/497,289 dated May 22, 2012.
USPTO Office Action for U.S. Appl. No. 12/502,058 dated Dec. 8, 2010.
USPTO Office Action for U.S. Appl. No. 12/502,058 dated Aug. 19, 2011.
USPTO Notice of Allowance for U.S. Appl. No. 12/502,058 dated Apr. 16, 2012.
USPTO Office Action for U.S. Appl. No. 12/534,829 dated Apr. 19, 2011.
USPTO Notice of Allowance for U.S. Appl. No. 12/534,829 dated Oct. 28, 2011.
USPTO Notice of Allowance for U.S. Appl. No. 12/534,829 dated Dec. 5, 2011.
USPTO Notice of Allowance for U.S. Appl. No. 12/534,829 dated Dec. 21, 2011.
USPTO Office Action for U.S. Appl. No. 12/573,820 dated Mar. 2, 2011.
USPTO Office Action for U.S. Appl. No. 12/573,820 dated Oct. 11, 2011.
USPTO Office Action for U.S. Appl. No. 12/749,466 dated Jun. 29, 2011.
USPTO Office Action for U.S. Appl. No. 12/749,476 dated Apr. 11, 2011.
USPTO Office Action for U.S. Appl. No. 12/749,476 dated Nov. 8, 2011.
USPTO Notice of Allowance for U.S. Appl. No. 12/749,476 dated May 4, 2012.
USPTO Notice of Allowance for U.S. Appl. No. 12/762,269 dated Apr. 23, 2012.
USPTO Office Action for U.S. Appl. No. 12/762,271 dated Jun. 6, 2012.
USPTO Notice of Allowance for U.S. Appl. No. 12/778,718 dated Apr. 3, 2012.
USPTO Notice of Allowance for U.S. Appl. No. 12/778,718 dated Jun. 13, 2012.
USPTO Office Action for U.S. Appl. No. 12/868,441 dated Apr. 30, 2012.
USPTO Office Action for U.S. Appl. No. 12/880,803 dated Feb. 22, 2012.
USPTO Office Action for U.S. Appl. No. 12/883,093 dated Mar. 13, 2012.
USPTO Office Action for U.S. Appl. No. 12/883,652 dated Apr. 17, 2012.
USPTO Office Action for U.S. Appl. No. 12/884,993 dated Mar. 16, 2012.
USPTO Office Action for U.S. Appl. No. 13/014,622 dated Nov. 28, 2011.
USPTO Office Action for U.S. Appl. No. 13/014,622 dated Apr. 30, 2012.
USPTO Office Action for U.S. Appl. No. 13/046,565 dated Apr. 13, 2012.
International Preliminary Report & Written Opinion of PCT Application No. PCT/US2011/037792, dated Sep. 8, 2011, 13 pages total.
Tyagi et al., 'Semipolar (1011) InGaN/GaN Laser Diodes on Bulk GaN Substrates,' Japanese Journal of Applied Physics, vol. 46, No. 19, 2007, pp. L444-L445.
USPTO Office Action for U.S. Appl. No. 12/995,946 dated Jan. 29, 2013.
USPTO Office Action for U.S. Appl. No. 12/534,838 dated May 3, 2011.
USPTO Office Action for U.S. Appl. No. 12/534,838 dated Jan. 13, 2012.
USPTO Office Action for U.S. Appl. No. 12/534,838 dated Mar. 20, 2012.
USPTO Notice of Allowance for U.S. Appl. No. 12/534,838 dated Jun. 8, 2012.
USPTO Office Action for U.S. Appl. No. 12/859,153 dated Feb. 26, 2013.
USPTO Office Action for U.S. Appl. No. 12/942,817 dated Feb. 20, 2013.
USPTO Notice of Allowance for U.S. Appl. No. 13/108,645 dated Jan. 28, 2013.
USPTO Office Action for U.S. Appl. No. 13/291,922 dated Feb. 20, 2013.
USPTO Office Action for U.S. Appl. No. 13/425,354 dated Feb. 14, 2013.
USPTO Office Action for U.S. Appl. No. 13/548,312 dated Mar. 12, 2013.
USPTO Office Action for U.S. Appl. No. 13/606,894 dated Feb. 5, 2013.

(56) References Cited

OTHER PUBLICATIONS

Office action for U.S. Appl. No. 12/873,820 (Oct. 11, 2012).
Office action for U.S. Appl. No. 12/749,466 (Feb. 3, 2012).
Office action for U.S. Appl. No. 13/046,565 (Feb. 2, 2012).
Office action for U.S. Appl. No. 13/046,565 (Nov. 7, 2011).
Office action for U.S. Appl. No. 12/497,289 (Feb. 2, 2012).
Office action for U.S. Appl. No. 12/759,273 (Nov. 21, 2011).
Office action for U.S. Appl. No. 12/762,269 (Oct. 12, 2011).
Office action for U.S. Appl. No. 12/762,271 (Dec. 23, 2011).
Office action for U.S. Appl. No. 12/778,718 (Nov. 25, 2011).
Notice of Allowance for U.S. Appl. No. 12/762,278 (Nov. 7, 2011).
Abare "Cleaved and Etched Facet Nitride Laser Diodes," IEEE Journal of Selected Topics in Quantum Electronics, vol. 4, No. 3, pp. 505-509 (May 1998).
Asif Khan "Cleaved cavity optically pumped InGaN—GaN laser grown on spinel substrates," Appl. Phys. Lett. 69 (16), pp. 2418-2420 (Oct. 14, 1996).
Lin et al."Influence of Separate Confinement Heterostructure Layer on Carrier Distribution in InGaAsP Laser Diodes with Nonidentical Multiple Quantum Wells," Japanese Journal of Applied Physics, ;vol. 43, No. 10, pp. 7032-7035 (2004).
Okamoto et al. In "High-Efficiency Continuous-Wave Operation of Blue-Green Laser Diodes Based on Nonpolar m-Plane Gallium Nitride," The Japan Society of Applied Physics, Applied Physics Express 1 (Jun. 2008).
Park, "Crystal orientation effects on electronic properties of wurtzite InGaN/GaN quantum wells,",Journal of Applied Physics vol. 91, No. 12, pp. 9904-9908 (Jun. 2002).
Romanov "Strain-induced polarization in wurtzite III-nitride semipolar layers," Journal of Applied Physics 100, pp. 023522-1 through 023522-10 (Jul. 25, 2006).
Schoedl "Facet degradation of GaN heterostructure laser diodes," Journal of Applied Physics vol. 97, issue 12, pp. 123102-1 to 123102-8 (2005).
Communication from the Japanese Patent Office re 2012-079345 dated Jul. 4, 2013, 14 pages.
USPTO Office Action for U.S. Appl. No. 12/482,440 dated Aug. 15, 2013, 8 pages.
USPTO Office Action for U.S. Appl. No. 12/859,153 dated Jun. 21, 2013, 24 pages.
Communication from the Chinese Patent Office re 2010800458819 dated Feb. 27, 2014, 2 pages.
USPTO Office Action for U.S. Appl. No. 12/482,440 dated Feb. 13, 2014, 7 pages.
USPTO Office Action for U.S. Appl. No. 12/573,820 dated Oct. 9, 2013, 28 pages.
USPTO Office Action for U.S. Appl. No. 12/727,148 dated Nov. 21, 2013, 9 pages.
USPTO Office Action for U.S. Appl. No. 13/593,128 dated Sep. 26, 2013, 18 pages.
USPTO Office Action for U.S. Appl. No. 13/621,485 dated Oct. 8, 2013, 6 pages.
USPTO Notice of Allowance for U.S. Appl. No. 13/621,485 dated Feb. 4, 2014, 7 pages.

* cited by examiner

SOLID-STATE OPTICAL DEVICE HAVING ENHANCED INDIUM CONTENT IN ACTIVE REGIONS

This application claims priority to U.S. Provisional Application No. 61/061,980 filed Jun. 16, 2008, commonly assigned, and incorporate by reference in its entirety herein.

BACKGROUND OF THE INVENTION

The present invention is directed to optical devices and related methods. More particularly, the present invention provides a method and device for emitting electromagnetic radiation for multi-colored devices using non-polar or semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

In the late 1800's, Thomas Edison invented the lightbulb. The conventional lightbulb, commonly called the "Edison bulb," has been used for over one hundred years. The conventional light bulb uses a tungsten filament enclosed in a glass bulb sealed in a base, which is screwed into a socket. The socket is coupled to an AC power source or a DC power source. The conventional light bulb can be found commonly in houses, buildings, and outdoor lighting applications, and other areas requiring light. Unfortunately, drawbacks exist with the conventional Edison light bulb. That is, the conventional light bulb dissipates much thermal energy leading to inefficiencies. More than 90% of the energy used for the conventional light bulb dissipates as thermal energy. Additionally, the conventional light bulb routinely fails often due to thermal expansion and contraction of the filament element.

To overcome some of the drawbacks of the conventional light bulb, fluorescent lighting has been developed. Fluorescent lighting uses an optically clear tube structure filled with a halogen gas. A pair of electrodes is coupled between the halogen gas and couples to an alternating power source through a ballast. Once the gas has been excited, it discharges to emit light. Often times, the optically clear tube is coated with phosphor materials. Many building structures use fluorescent lighting and, more recently, fluorescent lighting has been fitted onto a base structure, which couples into a standard socket.

Solid state lighting techniques have also been used. Solid state lighting relies upon semiconductor materials to produce light emitting diodes, commonly called LEDs. At first, red LEDs were demonstrated and introduced into commerce. Red LEDs use Aluminum Indium Gallium Phosphide (or AlInGaP) semiconductor materials. Most recently, Shuji Nakamura pioneered the use of InGaN materials to produce LEDs emitting light in the blue color range for blue LEDs. The blue colored LEDs lead to innovations such as the Blu-eRay™ DVD player, solid state white lighting, and other developments. Other colored LEDs have also been proposed.

High intensity green LEDs based on GaN have been proposed and even demonstrated with limited success. Unfortunately, achieving high intensity, high-efficiency GaN-based green LEDs has been problematic. The performance of optolectronic devices fabricated on conventional c-plane GaN suffer from strong internal polarization fields, which leads to poor radiative recombination efficiency. Since this phenomenon becomes more pronounced in InGaN layers with increased indium content for increased wavelength emission, extending the performance of GaN-based LEDs to the green regime has been difficult. Furthermore, increased indium content in a GaN film often requires reduced growth temperature leading to poorer crystal quality of high-indium-content InGaN films. The difficulty of achieving a high intensity green LED has lead scientists and engineers to the term "green gap" to describe the generally unavailability of such green LED. These and other limitations may be described throughout the present specification and more particularly below.

From the above, it is seen that techniques for improving optical devices is highly desired.

BRIEF SUMMARY OF THE INVENTION

According to the present invention, techniques related generally to optical devices are provided. More particularly, the present invention provides a method and device for emitting electromagnetic radiation for multicolored devices using non-polar or semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

The present invention provides an approach for producing high-In-content (>5%) In containing layers such as InGaN, InAlN, InAlGaN in GaN-based light emitting devices such as laser diodes and light emitting diodes (LEDs) on nonpolar and semipolar GaN substrates. The growth of quality In-containing layers such as InGaN with sufficient In content to achieve emission wavelengths beyond 400 nm to the blue, green, yellow and red regime has historically been difficult [1]. This difficulty manifests itself with a reduction of material quality as the MOCVD reactor growth conditions are changed to facilitate increased-In-content InGaN. More specifically, the reduced growth temperatures required to prevent In evaporation are known to lead to poor crystal quality. The microstructural nature of the degraded material is a contentious topic as some research groups attribute it to compositional In fluctuations, while others claim it is a result of localized strain. In any case, the poor material quality has prevented the demonstration of an efficient laser diode at wavelengths beyond 400 nm.

Here we propose to use selective area epitaxy (SAE) to achieve increased-In-content InGaN layers without changing the MOCVD reactor growth conditions. That is, for the same growth pressure, temperature, and partial pressures of the In and Ga precursors, the solid composition of the InGaN film will possess higher In levels. This technique will enable increased temperature growth conditions to avoid the low temperatures conditions commonly used for increased-In-content InGaN) that are known to degrade crystal quality. In SAE, a dielectric ($SiO_2$, $Si_xN_y$, etc) mask is deposited on the substrate surface, lithographically patterned, and then etched such that various geometries of exposed semiconductor are realized. For laser diode fabrication the geometry of the unmasked area is often a long (100s of microns) narrow (1-5 microns) stripe. When subjected to epitaxial growth in an MOCVD reactor where the group-III precursors have a high surface and gas phase mobility, growth initiation can be prevented in the masked areas. A growth rate enhancement is observed in the unmasked areas adjacent to the dielectric mask from the increased concentration of the growth rate limiting group-III (In and Ga) adatoms within these areas. The lack of depletion of the group-III precursor molecules in the gas phase over the masked regions coupled with the high surface mobility of the group-III adatoms on the masked areas leads to an increased concentration of the group-III adatoms present in the growth area adjacent to the dielectric mask boundary. A key aspect of our invention is that the difference between the diffusion properties of the In and Ga precursors leads to In-enrichment in the InGaN layer adjacent to the dielectric mask. The metalorganic compounds trimethylindium (TMIn) and trimethylgallium (TMGa) are often used as the source material for In and Ga, respectively. The TMIn molecule decomposes more efficiently than TMGa in the high temperature MOCVD growth conditions, leading to a reduced average size of the In containing metalorganic molecules. Since the gas-phase diffusion coefficient increases with reduced molecule size, the In precursors will have a higher diffusivity and will therefore more readily arrive in the growth areas. The result is a relatively higher In content in the In and Ga containing layer (i.e. InGaN) adjacent to the dielectric mask for a given set of reactor conditions. The kinetics of SAE are a well understood phenomenon in traditional alloys such as InGaAs and InGaAsP [2]. Literature reports similar phenomenon on polar GaN, where researchers have grown InGaN quantum dots and multi-color LEDs using SAE.

In our invention, we will employ SAE to overcome the formidable challenge of realizing high-In-content InGaN quantum wells for the fabrication of high-efficiency laser diodes and LEDs with extended wavelengths beyond 450 nm into the blue, green, yellow and red regimes. Our implementation of SAE will facilitate increased In incorporation in the In containing layer such as InGaN quantum wells adjacent to the masked region under identical growth conditions. This technique will be executed on nonpolar and/or semipolar GaN substrates to facilitate high-efficiency long-wavelength laser diodes and LEDs. Lasers and LEDs fabricated on conventional polar (c-plane) GaN suffer from internal piezoelectric and spontaneous polarization fields that intrinsically reduce the radiative recombination efficiency of electron-hole pairs and limit the device performance [3,4]. Early demonstrations of laser diodes fabricated on nonpolar (m-plane) GaN substrates operating at 405 nm and 451.8 nm show great promise for enhanced device performance [5, 6]. Furthermore, high-power green (516 nm) light emitting diodes (LED) fabricated on semipolar substrates indicate a natural tendency for increased In-incorporation on these crystallographic planes [7]. By coupling this enhanced In-incorporation behavior with minimized internal piezoelectric and spontaneous fields on semipolar substrates with our proposed SAE method for increased In-incorporation, our invention will enable the fabrication of high-efficiency blue, green, yellow and red emitting laser diodes and LEDs.

Laser diodes will be fabricated by patterning a dielectric mask either directly on the nonpolar/semipolar substrate or on an n-doped layer grown on the said substrates to form narrow stripes of unmasked growth area. The wafers will then be subjected to MOCVD growth where growth will initiate with an n-type GaN cladding layer, followed by the active region containing In containing quantum wells such as InGaN. The growth of the InGaN quantum wells in these narrow unmasked stripe areas will result in high-In-content quantum wells based on the SAE kinetics discussed above, pushing the emission wavelength to values required for blue, green, yellow and red emission. After deposition of the active region layers, the growth can be continued to deposit the p-GaN upper cladding layer or the growth can be interrupted. In the latter case, the sample would be removed from the reactor, the dielectric mask selectively etched, and the sample would be subjected to a regrowth for the definition of the p-cladding layer to realize a buried stripe laser structure. In the former case, where the p-cladding is defined in the same growth as the active region, surface ridge laser architectures could be easily fabricated from the resulting epitaxial structure.

LEDs will be fabricated in a very similar fashion to the lasers discussed above, however long stripe geometries will no longer be required because there is no need for in-plane optical guiding. For LED fabrication, arrays of small area rectangular, square, or circular geometries could be patterned in the mask. By having these 2-dimensional shapes, the In-incorporation would be further enhanced relative to the stripe geometries since excess group-III adatoms would be arriving from all directions around the growth area, not just from two sides as in narrow stripe geometries. With these arrays the dimension of the LED would be increased by keeping a high Indium composition (~up to 1 mm). After SAE is completed to grow the high In-containing active layers within these areas, a common p-cladding and/or electrode would be placed over all the light emitting structures such that they can all be activated with a single applied current.

In the above examples, the mask pattern was formed directly on nonpolar/semipolar substrates or on an n-doped layer grown on such substrates. The mask pattern was formed just under the In-containing active layer for SAE to be most effective for In enrichment in layers such as InGaN, InAlGaN and INAlN. Then, the In containing active layer is grown using a high growth temperature for good crystal quality. In this case, the abnormal growth at the edge of the mask pattern could be minimized since the thickness of the SAE is minimized. Often times, the growth rate at the edge of the mask pattern is abnormally high. Thus, at least In containing active layer should be grown using SAE.

In a specific embodiment, we will exploit the growth kinetics of SAE to overcome the difficulties in achieving high-In-content InGaN quantum wells for long wavelength GaN based laser diodes and LEDs on nonpolar/semipolar GaN substrates. This present method and structure apply not only to InGaN layers, but also to all relevant In-containing active layer such as InGaN, InAlGaN and InAlN where increased-In-content layers are desired at high growth temperatures. Not only is our proposed use of SAE an innovative implementation to solve the In-incorporation problem, the concept of doing so on nonpolar/semipolar substrates adds to the novelty of the invention since device fabrication and optimization methods on these substrates is still immature due to their recent availability. The demonstration of efficient laser diodes/LEDs and high In-incorporation on such substrates mentioned above reinforces the viability and promise of our approach for high-efficiency blue/green/yellow/red laser diodes and LEDs.

Still further, the present invention provides a multi-colored optical device capable of emitting light in at least about 400 and beyond nanometer range. The device has a gallium containing substrate structure having a surface region. The device has a region of insulating material, which is also a non growth region, having two or more growth regions provided on the surface region. The two or more growth regions are two or more exposed regions of the surface region according to a specific embodiment. The device also has an array configuration formed by the two or more growth regions including a first growth region and a second growth region, the array configuration being defined by N and M, where either N or M is an integer greater than 1. The device has a first semi-polar gallium indium containing crystalline material provided on a portion of the first growth region of the gallium containing substrate structure. The first semi-polar gallium indium containing crystalline material has a thickness of about 1 nanometers to about 20 nanometers according to a specific embodiment. The device has a second semi-polar gallium indium containing crystalline material provided on a portion of the second growth region of the gallium containing substrate structure. In a specific embodiment, the second semi-polar gallium indium containing crystalline material has a thickness of about 1 nanometers to about 20 nanometers. The device also has a first spatial width dimension characterizing the first growth region and a second spatial width dimension characterizing the second growth region. In a specific embodiment, the device has a first indium concentration characteristic associated with a first color characteristic provided in the first growth region and a second indium concentration characteristic associated with a second color characteristic provided in the second growth region. Of course, there can be other variations, modifications, and alternatives. That is, the present LED device can also provided on a non-polar GaN substrate structure.

In a specific embodiment, a method for forming a crystalline gallium indium nitride material or layer is provided. The method includes providing a gallium containing substrate structure having a surface region. The gallium containing substrate structure has a semipolar or nonpolar surface orientation in a specific embodiment. A first gallium indium containing crystalline material is formed overlying a portion of the surface region. The first gallium indium containing crystalline material has a first indium concentration. The first gallium containing crystalline material is characterized by a first spatial width of no greater than a predetermined dimension. The first indium concentration is greater than a second indium concentration associated with a second gallium nitride containing crystalline material characterized by a second spatial width. The second spatial width is greater than the first spatial width in a specific embodiment. In a specific embodiment, an array configuration is provided by the two or more growth regions including a first growth region characterized by a first indium concentration and a second growth region characterized by a second indium concentration. In a specific embodiment, the array configuration is defined by N and M, where either N or M is an integer greater than 1.

In a specific embodiment, a multi-colored light emitting optical device structure is provided. The light emitting optical device structure includes a gallium containing substrate structure having a surface region. The gallium containing substrate structure has a semipolar or nonpolar surface orientation in a specific embodiment. A first gallium indium containing crystalline material has a first indium concentration in a specific embodiment. A first spatial width of no greater than a predetermined dimension characterizes the first gallium indium containing crystalline material. A second gallium indium containing crystalline material has a second indium concentration in a specific embodiment. A second spatial width of no greater than a predetermined dimension characterizes the second gallium indium containing crystalline material. In a specific embodiment, the first indium concentration is greater than the second indium concentration associated with the second gallium nitride containing crystalline material characterized by a second spatial width. The second spatial width is greater than the first spatial width in a specific embodiment. In a specific embodiment, an array configuration is provided by the two or more growth regions including a first growth region and a second growth region. In a specific embodiment, the array configuration is defined by N and M, where either N or M is an integer greater than 1.

In yet an alternative embodiment, the present invention provides a method for processing one or more precursor species to form a gallium containing film. The method includes providing a non-polar or semi-polar gallium and nitrogen containing substrate having a surface region. The method also includes forming a dielectric masking layer overlying the surface region to expose two or more growth regions. Preferably, the two or more growth region are substantially two or more exposed gallium and nitrogen containing crystalline material regions. Each of the two or more growth regions has a spatial dimension of no greater than about ten microns in one of a narrowest dimension. The method includes loading the non-polar or semi-polar gallium and nitrogen containing substrate onto a susceptor in a reaction chamber. The susceptor is at a temperature ranging from about 600 Degree Celsius to about 1200 Degree Celsius, but can be others. The method also includes introducing an indium precursor species, introducing nitrogen bearing species, and introducing gallium precursor species. The method combines the indium precursor species, nitrogen bearing species, and the gallium precursor species, and possibly other species according to one or more embodiments. The method initiates growth of a crystalline material within the two or more exposed regions while maintaining the dielectric masking layer substantially free from growth of the crystalline material. The method further includes maintaining a reaction temperature of about 500 Degrees Celsius to about 1200 Degrees Celsius for the crystalline material capable of emitting electromagnetic radiation. The crystalline material has a higher indium concentration compared to an indium concentration provided on a growth region of greater than about 15 microns. In one or more embodiments, it is believed that one or more of the indium species diffuses at a faster rate than one or more of the gallium species to cause the higher indium concentration at the growth region, although there could be other mechanisms. The method includes forming an indium and gallium and nitrogen containing crystalline material.

In a specific embodiment, the present invention provides a method for processing one or more precursor species to form a gallium containing film. The method includes providing a non-polar or semi-polar gallium and nitrogen containing substrate having a surface region. The method also includes initiating growth of a crystalline material within two or more exposed regions. In a preferred embodiment, the crystalline material is capable of emitting electromagnetic radiation. The crystalline material has a higher indium concentration compared to an indium concentration provided on a growth region of greater than a spatial dimension of the two or more exposed growth regions.

Other benefits are achieved over conventional techniques. For example, the present method and device achieves high brightness and high resolution lighting technologies that require blue, green, yellow or red contributions such as high resolution red-green-blue displays, communications in polymer-based fibers, or solid-state lighting based on red-green-blue or blue-yellow laser diodes and LEDs. In a specific embodiment, the present invention provides improved crystal quality, highly efficient laser diodes and LEDs on nonpolar/semipolar. GaN will enable laser and LED emission in the blue, green, yellow and red bands, allowing the realization of true color displays based on red-green-blue or blue-yellow laser diodes. In a preferred embodiment, the absence of polarization fields in the quantum wells on the substrates along with the increased growth temperatures enabled by SAE will facilitate high efficiency device operation. Thus, this technology would allow for the improvement of existing devices such as 405 nm lasers used in HD-DVD and Sony Blue-Ray along with completely new technologies demanding blue, green, yellow and red emission and low power consumption.

It is believed that the use of SAE for the purpose of realizing high-In-content InGaN layers in lasers diodes and LEDs grown on nonpolar/semipolar GaN substrates has not been proposed prior to this document.

DETAILED DESCRIPTION OF THE INVENTION

Figure 1:
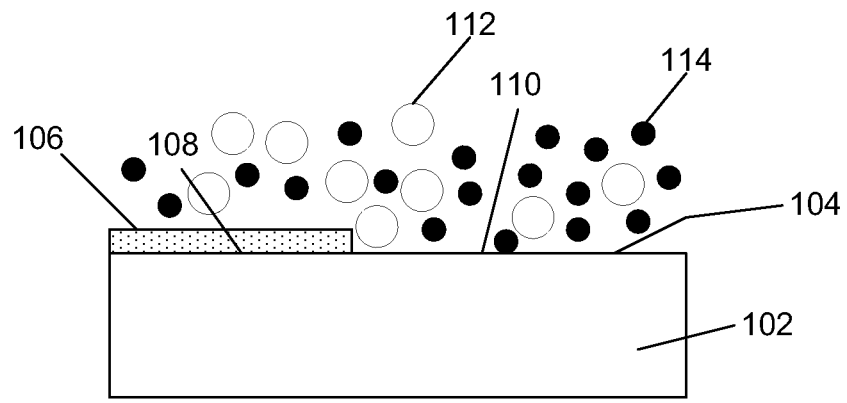
FIG. 1 is a schematic diagram illustrating the change in relative concentration of the In and Ga precursor molecules in the vicinity of a dielectric mask boundary.

According to the present invention, techniques related generally to optical devices are provided. More particularly, the present invention provides a method and device for emitting electromagnetic radiation for multicolored devices using non-polar or semipolar gallium containing substrates such as GaN, AlN, InN, InGaN, AlGaN, and AlInGaN, and others. Merely by way of example, the invention can be applied to optical devices, lasers, light emitting diodes, solar cells, photoelectrochemical water splitting and hydrogen generation, photodetectors, integrated circuits, and transistors, among other devices.

The present invention is directed to generate high efficiency GaN-based light emitting devices operating at wavelengths beyond 400 nm for blue, green, yellow and red emission according to embodiments of the present invention. The proposed device will be used as an optical source for various commercial, industrial, or scientific applications. These structures are expected to find utility in existing applications where blue-violet, blue, green, yellow and red laser/LED emission is required. An existing application includes HD-DVD and Sony Blu-Ray™ players. One particularly promising application for these devices is full color displays requiring red-green-blue or blue-yellow color mixing. Another potential application is for optical communication through polymer based fibers where increased wavelengths will result in reduced loss.

At this time, commercial GaN-based edge-emitting laser diodes and LEDs are grown on c-plane GaN [8-10]. These devices have found applications in several consumer products such as high definition DVD players where the lasers operate at 405 nm. However, when the MOCVD growth conditions are changed to facilitate increased-In content in the quantum well active region to lower the bandgap and increase the operation wavelength, a marked decrease in material quality is observed [1]. A likely candidate for this effect is the reduced growth temperature required to prevent In evaporation as it is well known that crystal quality in ammonia based GaN growth degrades with temperature. The degradation is thought to be a result of poor In mobility in the InGaN wells due to a low temperature growth or due to detrimental strain effects. This phenomenon has prevented the demonstration of a highly efficient semiconductor laser diode emitting blue, green, yellow or red light.

A laser operating at 488 nm was demonstrated [11]. Although this device offers some promise, it was realized on c-plane GaN where the performance will be intrinsically limited by the piezo and spontaneous electric fields inherent to InGaN quantum wells grown in this orientation. The electric fields spatially separate the electron and hole wave functions due to the quantum confined Stark effect, reducing the radiative efficiency [3]. Furthermore, the result in [11] was achieved through the optimization of growth conditions to limit the material quality degradation and there is no evidence to suggest that such an approach could be used to extend the wavelength to higher values based on simple growth optimization.

SAE has been demonstrated in GaN epitaxial growth for different applications. The most common application is for lateral epitaxial overgrowth (LEO) to create a buffer layer with enhanced crystal quality when growth is performed on mismatched substrates such as SiC and sapphire [12]. However, in this application there is no growth of InGaN layers in the presence of an exposed dielectric mask and thus its intention is clearly not to yield increased-In content InGaN layers. Another application for SAE on c-plane GaN is to create current confinement in surface ridge laser diodes [13]. In this process the dielectric is deposited and patterned after the growth of the n-GaN cladding layer, quantum well active region, and a portion of the p-GaN cladding. Only the remaining p-GaN upper cladding layer is grown with the patterned dielectric on the sample surface. As in LEO, this implementation is clearly not intended for increased-In-composition InGaN since no such layer is grown in the presence of the dielectric mask.

A third application for SAE on c-plane GaN is for the realization of quantum dot like structures where the dielectric mask is patterned to yield small dimensional geometries of growth area [14]. In this application, the InGaN layers were grown in the presence of the dielectric mask and the emission wavelength of the resulting structures was observed to depend on the mask geometries. However, the purpose of the work was to define low dimensional structures using SAE, not to increase the operation wavelength of edge-emitting laser diodes. Another application of SAE on c-plane GaN is to form multi-color light emitting diode (LED) structures as in [15, 16], where unmasked geometries are patterned in the dielectric mask on the GaN surface. Growth is initiated with a thick n-type GaN layer such that a tall (3-4 µm) mesa is formed, exposing three different crystallographic planes including the semipolar (11-22) plane. After mesa formation, InGaN quantum well layers are grown and capped with a p-type InGaN cladding layer. The resulting compositional differences between the InGaN quantum wells on the different crystal planes leads to multi-wavelength emission. It is very important to note that our invention will not use SAE for the formation of multiple crystallographic for InGaN growth. Rather, our invention will focus on the growth of high-In-content active layers on the planar growth surface dictated by the nonpolar/semipolar GaN substrate orientation.

In summary, previous work either did not grow the InGaN quantum well layers in the presence of a dielectric mask or the intentions were to form quantum dot like structures or faceting for multi-color LEDs on non-planar surfaces to exploit the differences in the crystallographic planes. Furthermore, none of the aforementioned embodiments of SAE were initiated on nonpolar/semipolar GaN substrates, where enhanced device performance is expected. Details of the present invention can be found throughout the present specification and more particularly below.

The invention provides a GaN-based semiconductor laser/LED growth/fabrication method to achieve increased wavelength operation into the blue, green, yellow and red regime on nonpolar/semipolar GaN substrates where superior laser/LED performance can be expected. The device relies on selective area epitaxy (SAE) to enhance the In incorporation in the InGaN quantum well layers grown in narrow unmasked striped regions. The increased diffusion of the In containing molecules relative to the Ga containing molecules leads to enriched-In in the In containing layer such as InGaN under identical growth conditions.

Figure 2:
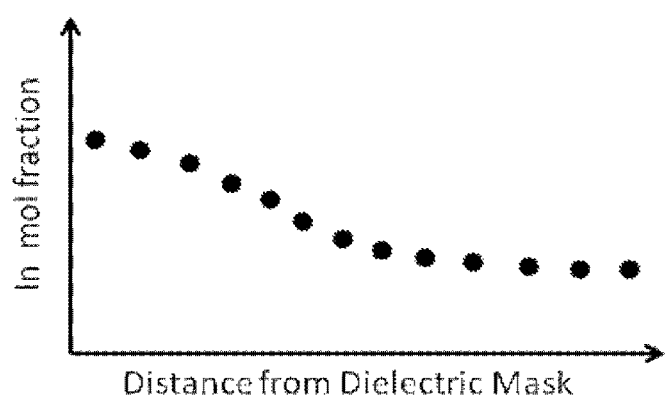
FIG. 2 is a simplified plot of In mol fraction versus distance from dielectric mask boundary in In and Ga epitaxial layers illustrating the increased In content near the mask edge according to an embodiment of the present invention.

The enhanced In incorporation in the epitaxial layer adjacent to the mask region can be understood by the relative decomposition efficiency between TMIn and TMGa, which act as the In and Ga growth precursors. It has been shown that the TMIn molecule decomposes more efficiently than TMGa [2]. In this process, the methyl groups are separated from the organic molecules until the In and Ga reside in their atomic form. As this decomposition occurs, the radius of the molecule is reduced. Since smaller molecules will more easily diffuse in the gas matrix, the partially decomposed molecules with reduced radii will more readily travel through the MOCVD process gases and arrive at the growth surface where they incorporate into the growing film. The increased efficiency of TMIn decomposition will lead to a smaller average radius for the In containing molecules, increasing the average gas phase diffusion coefficient to a larger extent than the Ga containing molecules. As a result, In is able to migrate to the growth regions adjacent to the mask in greater abundance than the Ga containing molecules, leading to an In-enriched layer. A schematic diagram illustrating the relative concentrations of these molecules with respect to the boundary between the masked 108 and growth region 110 is shown in FIG. 1. In the figure, it can be seen that above the mask 106 far from the boundary there is a relatively high number of Ga containing molecules 112, in the vicinity of the boundary the relative concentration of In molecules 114 becomes higher than Ga, and in the unmasked regions 104 of the substrate 102 far from the boundary, the relative concentration of each molecule returns to its equilibrium value since it is unaffected by the mask. The resulting film has an In composition that follows the gas phase concentration profile leading to enriched-In films in regions adjacent to the mask as shown in FIG. 2. Such growth kinetics have been exploited for InP and GaAs based devices to modulate the composition and quantum well thickness for monolithic photonic integration [17].

Figure 3:
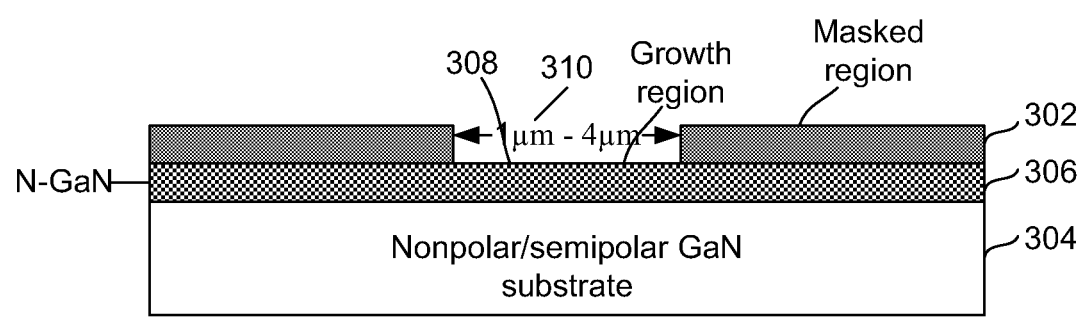
FIG. 3 is a simplified side view schematic of narrow stripe dielectric mask deposited and patterned on n-GaN layer grown on nonpolar/semipolar substrate according to an embodiment of the present invention.
Figure 4:
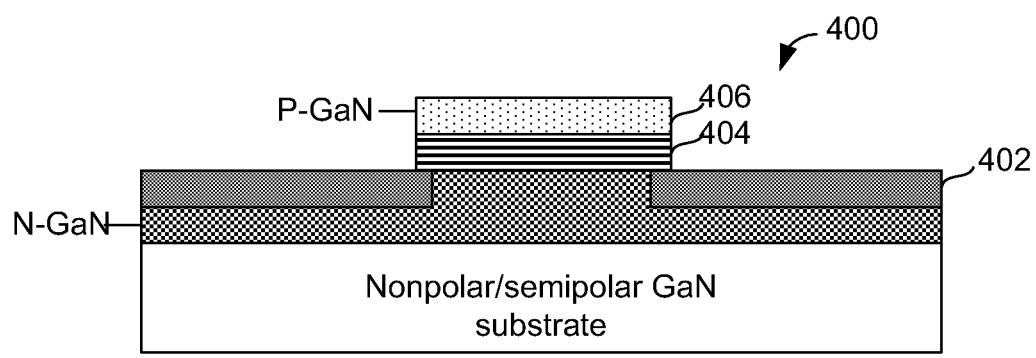
FIG. 4 is a simplified cross-sectional side-view schematic of high-In-content quantum well active region grown in the narrow mask opening using SAE according to an embodiment of the present invention.

In our embodiment of SAE on nonpolar/semipolar GaN substrates 304, laser fabrication will initiate with the deposition of a dielectric mask 302 either on the substrate 304 itself or on an ntype GaN layer 306 grown on top of the substrate. The dielectric mask 302 will be lithographically patterned and etched to define narrow (1-4 um 310) stripes 308 of unmasked area. FIG. 3 presents a schematic cross-sectional diagram of such a stripe 308. The unmasked stripe width along with the amount of masked area adjacent to the stripe will determine the growth rate, relative In incorporation, and uniformity of the InGaN layers to be grown. Therefore, careful simulation and experiment must be carried out to optimize the geometry for our intended purpose. Following the mask patterning, the sample will be subjected to MOCVD growth, where the n-GaN cladding, the InGaN quantum well active region, and finally the partial or complete p GaN cladding will be grown. The key is that the quantum wells are grown in the presence of the dielectric mask such that the InGaN In incorporation is enhanced for increased emission wavelength. A schematic cross-sectional diagram depicting the resulting epitaxial structure 400 is presented in FIG. 4. As seen in the figure, lateral overgrowth of the dielectric mask 402 is expected, and the extent can be controlled with the growth conditions. Beyond the SAE step, there are several fabrication sequences that could be carried out for laser fabrication. The most straightforward would be for a surface ridge laser architecture utilizing the as-grown epitaxial stripe 404 to provide the lateral index contrast for optical wave guiding. In this case, a metal contact would be made to the entire p-GaN cladding layer 406 on the ridge top. Although straightforward, in this embodiment the lateral index discontinuity may be too large for high power kink-free operation.

Figure 5:
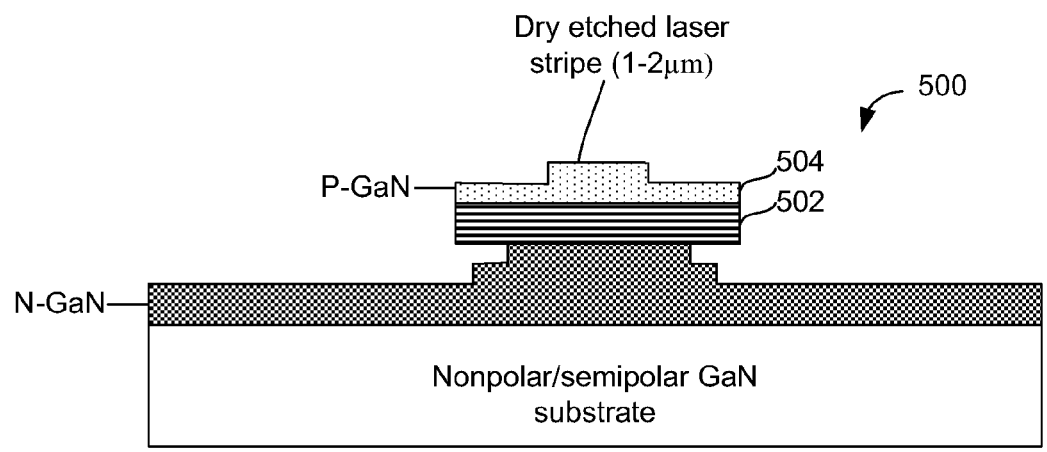
FIG. 5 is a simplified cross-sectional side-view schematic of surface ridge laser architecture with dry etched inner ridge for lateral mode confinement according to an embodiment of the present invention.

In a slightly more complicated surface ridge fabrication sequence, a dry etch step could be included to define a ridge stripe 504 within the SAE defined stripe 502. This could be accomplished by removing the dielectric mask from the sample after completion of the growth, performing a blanket dielectric deposition, and then lithographically patterning the dielectric mask to define narrow stripes within the SAE stripe. A dry etch would then be performed to achieve a precisely controlled etch depth to optimize the index contrast versus current confinement trade-off. An example of a possible resulting structure 500 is shown in FIG. 5 with a cross-sectional schematic.

Figure 6:
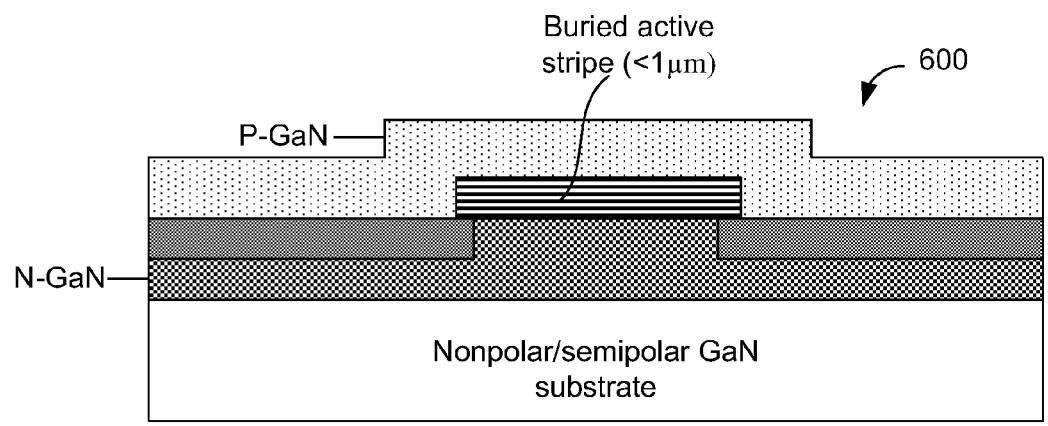
FIG. 6 is a simplified cross-sectional side-view schematic of buried ridge laser architecture realized with p-GaN cladding over growth of narrow active stripe defined using SAE according to an embodiment of the present invention.

In yet another embodiment of this invention, a buried stripe laser could be realized. This would be accomplished by first selectively removing the dielectric mask layer after the SAE growth. The sample would then be subjected to another growth step to bury the active stripe in the p-GaN cladding layer In order to reduce or suppress any current that may pass through the p-n junction formed by the p-GaN cladding layer and the n-GaN layer or substrate adjacent to the active region during device operation, techniques including but not limited to ion implantation may be used in order to effectively confine the current to the region defined by the indium gallium containing species in the device structure. More complex growth schemes may also be used in order to form an electrically insulating or semi-insulating layer in the region previously masked by the dielectric layer. A schematic cross-section of this buried stripe architecture 600 is shown in FIG. 6. Although in this embodiment a regrowth is required, it does offer several advantages. The most significant advantage is that very narrow active stripes can be realized since the width is dictated by the dielectric mask opening width, which can be made very narrow (<1□m) without introducing the excess scattering losses to the optical mode or excess resistance to the p-contact, which typically plagues very narrow surface ridge lasers. The epitaxial interface separating the InGaN active region from the adjacent p-GaN cladding will mitigate the excess scattering loss induced by narrow surface ridge devices where there is high sidewall interaction with the optical mode. The contact resistance can be very low in buried devices because the width of the p-contact will not be limited by the active stripe width. The reduced gain volume of the very narrow stripe widths will allow for reduced threshold currents for a laser of a given length. Furthermore, a buried architecture offers superior heat dissipation for increased efficiency and reduced threshold current density.

In a preferred embodiment, a buried stripe laser may be realized by forming a low-temperature p-GaN layer under specific reactor conditions such that the p-GaN layer is formed overlying both the dielectric mask region and the indium and gallium containing material. A conventional high-temperature p-GaN material may then be formed overlying this continuous low-temperature GaN material, thereby forming a common continuous high-temperature p-GaN material cladding overgrowth. In a specific embodiment, the p-GaN material is substantially continuous and forms overlying the array of growth regions or a block or selected group of growth regions and other combinations.

In the preceding paragraphs we have discussed several laser architectures that could be fabricated from our proposed SAE process to achieve high-In-content InGaN quantum wells for increased wavelength operation. It is important to note that there are several other architecture variations in which our SAE approach could be implemented could be implemented and they should not be excluded from this invention. It is also very important to note again that our invention is exclusive to laser/LED growth/fabrication on nonpolar/semipolar GaN substrates where superior performance is expected relative to devices on polar (c-plane) GaN.

All of the above discussion regarding laser fabrication is easily extended to LED fabrication. LEDs are typically large area devices (500×500 μm or larger) such that the effects of SAE could not exploited over the entire area with only a single region of unmasked growth area. Instead, LEDs would require arrays of small geometry active structures placed under a common cladding layer and/or electrode such that the all light emitting structures in the array could be excited with a single applied current. Although the 1-dimensional narrow stripes required for laser diodes could be used, 2-dimensional geometries such as squares, rectangles, or circles of unmasked areas would offer a further enhancement of In incorporation. This enhancement would result from the arrival of group-III adatoms to the growth area from all directions over the dielectric mask, opposed to just from two sides as in the narrow stripes. That is, the kinetics of SAE near a mask boundary that lead to increased growth rate and In incorporation would be much as stronger since the entire growth area in these 2-dimensional geometries would be surrounded by a mask edge.

In this record of invention, we listed several different implementations of SAE for the fabrication of high efficiency laser diodes and LEDs with extended wavelengths. However, there are several other laser/LED fabrication sequences that could be carried out with the use of SAE with the aim of increased In content In containing layer such as InGaN on nonpolar/semipolar substrates. Furthermore, in the above discussion we described very simple dielectric mask patterns consisting of long narrow stripes of unmasked regions for laser diode fabrication. We believe that more complex mask geometries could be implemented to achieve a desired effect. Such effects include modulating the In incorporation along the length of the laser stripe by varying the width of the stripe. This could find use in active/passive integration where regions of high and low bandgap are desired in a single laser diode. An example of this would employ narrow stripe widths in the center region of the laser diode where the lower bandgap light emitting region would reside and wide stripe widths at the ends of the laser diodes for an increased bandgap that would be transparent to emitted light. If the mirror facets of the laser were placed in the passive region, this would delay the onset of catastrophic facet damage.

In the case of LED fabrication, we mentioned the use of simple 2-dimensional mask pattern geometries such as rectangles, squares, and circles. However, this invention should not exclude more complex 2-dimensional geometries that could be beneficial to the performance of an LED. In summary, any laser or LED fabrication method that relies on SAE to achieve high-quality, high In-content layers such as InGaN on nonpolar/semipolar GaN substrates for blue/green/yellow/red laser and LED emission should not be excluded from the breadth of this invention.

This invention provides high-brightness blue and green LEDs could be used to make white LEDs with a combination of conventional AlInGaP red LEDs. This invention could be used to combine blue LEDs with a phosphor such as YAG to create white LEDs. Furthermore, we could add a conventional AlInGaP red LED into Blue/YAG phosphor white LEDs to improve the color rendering.

Figure 7A:
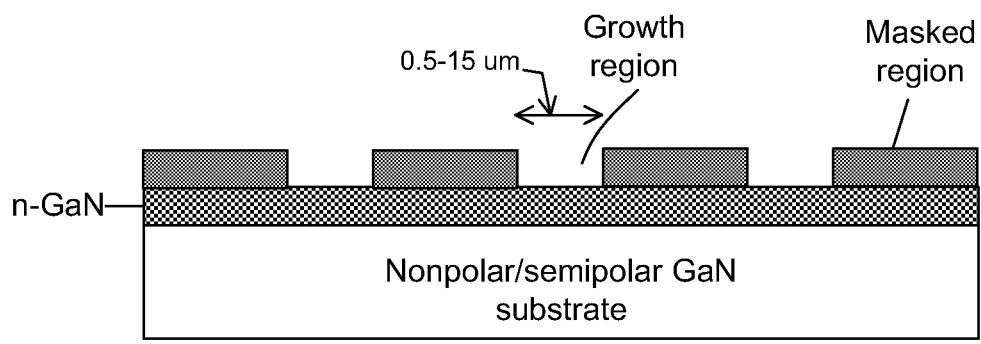
FIG. 7A is a simplified side view schematic of narrow 2-dimensional growth regions formed with dielectric mask deposited and patterned on n-GaN layer grown on nonpolar/semipolar substrate according to an embodiment of the present invention. Patterned mask could also be directly on substrate.

FIG. 7A Side view schematic of narrow 2-dimensional growth regions formed with dielectric mask deposited and patterned on n-GaN layer grown on nonpolar/semipolar substrate. Patterned mask could also be directly on substrate.

Figure 7B:
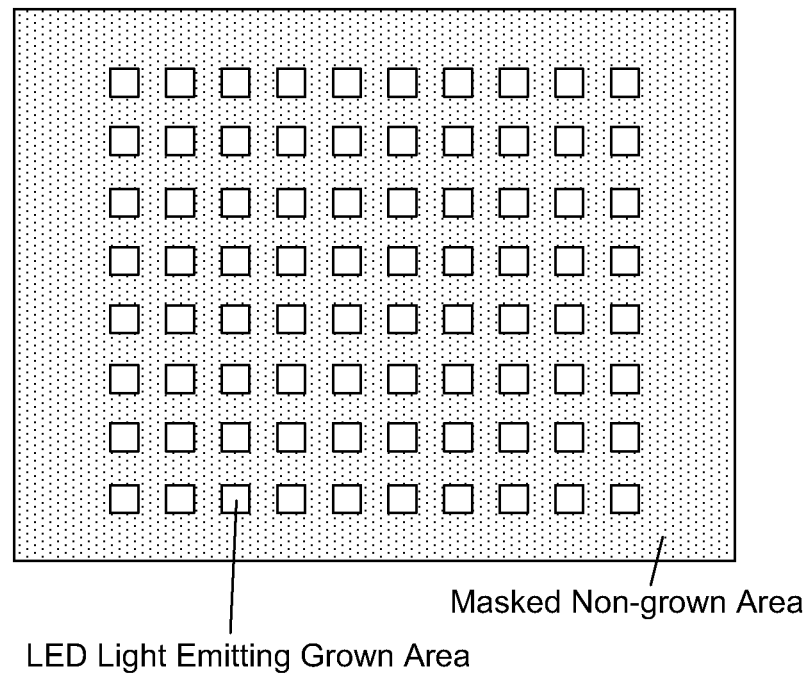
FIG. 7B is a simplified top view schematic of narrow 2-dimensional growth region formed with dielectric mask deposited and patterned on n-GaN layer grown on nonpolar/semipolar substrate according to an embodiment of the present invention. These narrow 2-dimensional growth regions could be of varied size, geometry, and density so as to tune the output color and brightness of the LED.

FIG. 7B Top view schematic of narrow 2-dimensional growth region formed with dielectric mask deposited and patterned on n-GaN layer grown on nonpolar/semipolar substrate. These narrow 2-dimensional growth regions could be of varied size, geometry, and density so as to tune the output color and brightness of the LED.

Figure 8:
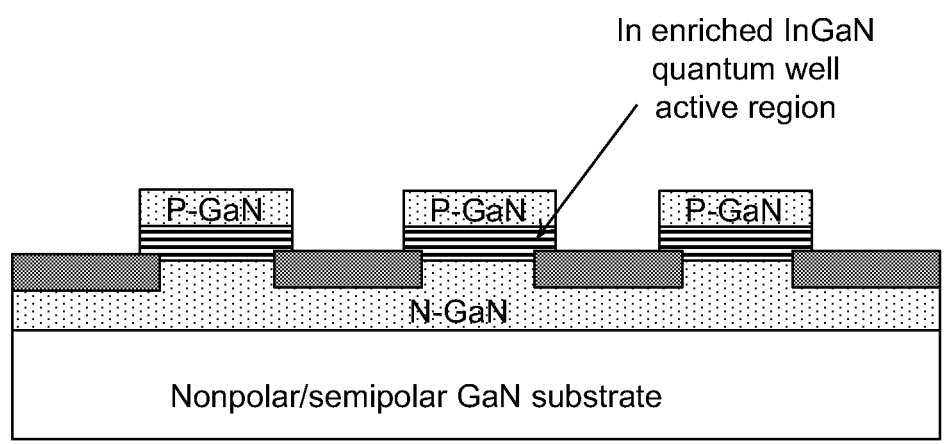
FIG. 8 is a simplified cross-sectional side-view schematic of multiple high-In-content quantum well active region grown in the narrow 2-dimensional mask opening using SAE according to an embodiment of the present invention.

FIG. 8 Cross-sectional side-view schematic of multiple high-In-content quantum well active region grown in the narrow 2-dimensional mask opening using SAE.

Figure 9:
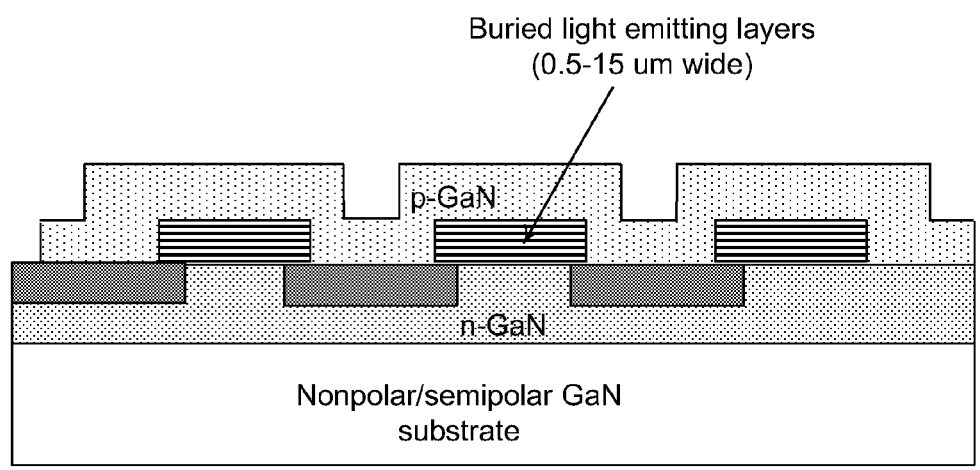
FIG. 9 is a simplified cross-sectional side-view schematic of light emitting layers formed in narrow 2-dimensional growth regions using SAE and then buried with a common p-GaN cladding overgrowth according to an embodiment of the present invention.

FIG. 9 Cross-sectional side-view schematic of light emitting layers formed in narrow 2-dimensional growth regions using SAE and then buried with a common p-GaN cladding overgrowth.

This invention provides methods and devices that offer a promising alternative technique to realize high-In-content films such as InGaN, InAlGaN, and InAlN on nonpolar/semipolar GaN substrates. Conventional methods for achieving high-In-content InGaN films rely on non-standard growth conditions that result in degraded material quality. For example, in conventional MOCVD growth the temperature must be reduced to limit the In evaporation. Our invention exploits SAE to alter the local growth kinetics to realize enhanced In incorporation, such that the growth can be performed at relatively high temperature to improve the crystal quality of InGaN layer. Due to this reason, this invention should be applied to all kinds of In containing layers such as InGaN. InAlGaN, InAlN and others under any In composition to improve the crystal quality of the layer at a higher growth temperature in order to make high efficient light emitting devices at any wavelength with a high quality In containing layer. For the SAE process described above, a simple dielectric mask is employed to enhance the concentration of In-containing molecules in the unmasked growth regions. InGaN films grown using this technique should therefore demonstrate enhanced In incorporation without the need for non-standard growth conditions that can degrade material quality. We have only mentioned the use of a dielectric mask. The use of any other mask material such as metal and others that on which SAE can be performed should not be excluded from this invention.

An epitaxial growth method according to the present invention may be outlined below.

1. Start;
2. Provide a non-polar or semi-polar gallium nitride containing substrate having a surface region;
3. Form a dielectric masking layer overlying the surface region to expose a growth region, which is substantially exposed gallium nitride crystalline material having a spatial dimension of no greater than about 7 microns in one of a narrowest dimension, but can be others;
4. Load the non-polar or semi-polar gallium nitride containing substrate onto a susceptor in a reaction chamber;
5. Cause an increase or maintain the susceptor at a temperature ranging from about 600 Degree Celsius to about 1200 Degree Celsius;
6. Introduce an indium precursor species;
7. Introduce a nitrogen containing species;
8. Introduce a gallium precursor species;
9. Combine the indium precursor species, nitrogen containing species and gallium containing species either prior to, during or shortly after their introduction into the reaction chamber;
10. Initiate selective growth of a crystalline material including indium and gallium within the exposed reaction region;
11. Control, modify or adjust the reaction chamber conditions including but not limited to the temperature, pressure and group V/III reactant species ratio so as to maintain the dielectric mask layer substantially free from growth of any crystalline material containing indium and gallium;
12. Maintain a reaction temperature of about 600 Degrees Celsius to about 1200 Degrees Celsius for the crystalline material capable of emitting UV or visible electromagnetic radiation so that the crystalline material has a higher indium concentration compared to the indium concentration of a crystalline material provided on a growth region of greater than about 15 microns (or other dimension), as a result of two or more of the indium species diffusing at a faster rate than two or more of the gallium species to cause the higher indium concentration at the growth region;
13. Cause formation of one or more indium gallium nitride containing material in an array configuration, as well as other materials containing gallium species; and
14. Perform other steps, as desired.

The above sequence of steps provides a method of forming a crystalline indium gallium nitride film capable of emitting electromagnetic radiation at a wavelength of greater than 365 nm, and others. In a specific embodiment, the molar concentration of indium in the resulting crystalline indium gallium nitride material may vary and preferably increase depending on a spatial width of the growth region thereby affecting the wavelength of emitted light. In a preferred embodiment, the method provides an array structure of growth regions.

Figure 10:
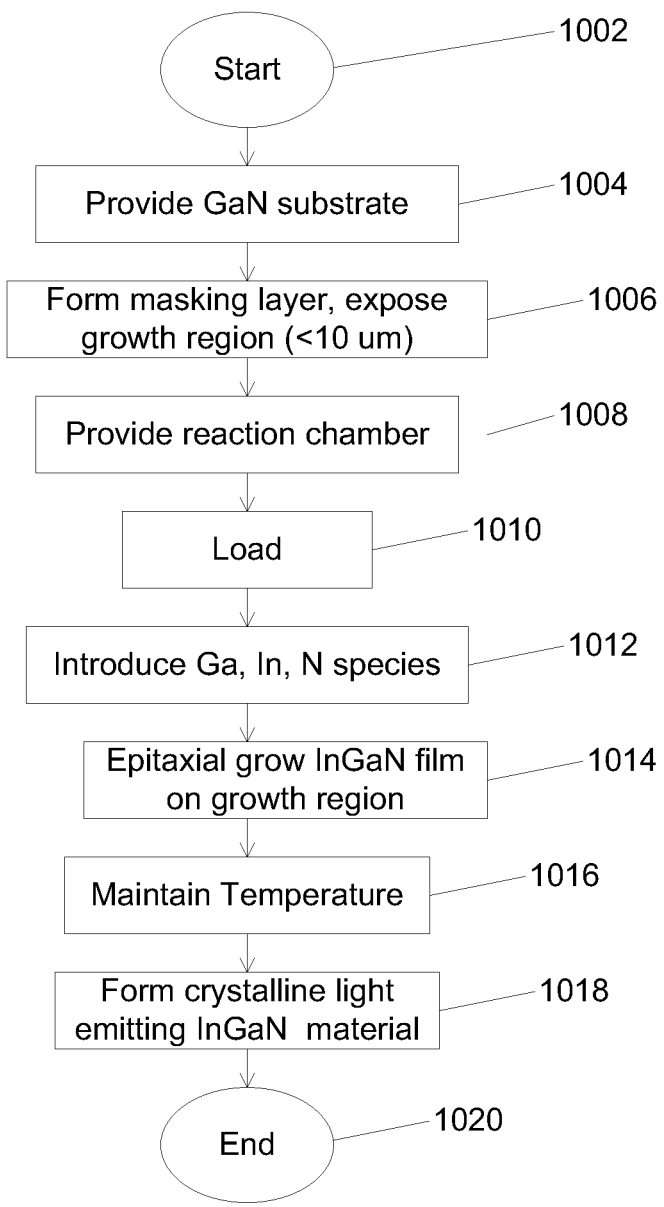
FIG. 10 is a simplified flow diagram illustrating a method of forming a crystalline gallium indium nitride film according to an embodiment of the present invention.

FIG. 10 is a simplified flow diagram illustrating a method of forming a crystalline gallium indium nitride material in an array configuration according to an embodiment of the present invention. As shown, the method includes a start step (step 1002), as an initial step. In a specific embodiment, a gallium nitride substrate is provided (Step 1004). In a preferred embodiment, the gallium nitride substrate has a semi-polar or a non-polar characteristics. As used herein, the term GaN substrate is associated with Group III-nitride based materials including GaN, InGaN, AlGaN, or other Group III containing alloys or compositions that are used as starting materials. Such starting materials include polar GaN substrates (i.e., substrate where the largest area surface is nominally an (h k l) plane wherein h=k=0, and l is non-zero), non-polar GaN substrates (i.e., substrate material where the largest area surface is oriented at an angle ranging from about 80-100 degrees from the polar orientation described above towards an (h k l) plane wherein l=0, and at least one of h and k is non-zero) or semi-polar GaN substrates (i.e., substrate material where the largest area surface is oriented at an angle ranging from about +0.1 to 80 degrees or 110-179.9 degrees from the polar orientation described above towards an (h k l) plane wherein l=0, and at least one of h and k is non-zero).

A masking layer is formed overlying a first region of the surface region and a growth region is exposed (Step 1006) according to a specific embodiment. The masking layer is commonly a hard mask made of silicon dioxide, silicon nitride, or other suitable materials according to a specific embodiment. The masking layer (or layers) is patterned using common techniques to form exposed regions configured to be in an array. In a specific embodiment, the exposed regions are exposed regions of gallium nitride material or gallium and nitrogen containing material, which will be subjected to a further process or processes. In a specific embodiment, the exposed region is also a growth region that is substantially exposed gallium nitride crystalline material or gallium and nitrogen containing crystalline material. The growth region has a spatial width dimension of no greater than about ten microns in one of a narrowest dimension, but can be others. In certain embodiments, the spatial width dimension can be no greater than about 7 microns or no greater than about 4 microns or no greater than about 2 microns. In a specific embodiment, the spatial width dimension can be no greater than about 4 microns or no greater than about 6 microns. Again, there can be other variations, which are explained below.

For example, two or more growth regions may be formed. The two or more growth regions can be configured as two or more strips, which may be commonly called stripes, arranged in a parallel configuration relative to each other. Each of the strips may also have a substantially similar width or different widths. Also depending on the application, at least two or more of the growth regions may be configured with a modulated width having a first dimension and a second dimension. Each of the two or more growth regions may also comprise a plurality of growth regions, arranged in an N by M array configuration, where N and M are integers greater than 1. The two or more of the plurality of growth regions may be configured with two or more spatial structures, including annular, trapezoidal, square, circular, polygon shaped, amorphous shaped, irregular shaped, triangular shaped, or any combinations of these, and others. In a specific embodiment, the array configuration of the grow regions provides a light emitting diode device or other optical device.

In a specific embodiment, the method provides a reaction chamber including a susceptor configured at a temperature ranging from about 600 Degree Celsius to about 1200 Degree Celsius (Step 1008). In a preferred embodiment, the reaction chamber is a suitable MOCVD reactor for depositing epitaxial materials of gallium and nitrogen containing crystalline materials, among others. Of course, there can be other variations, modifications, and alternatives. In a specific embodiment, the substrate including the masking layer is loaded onto the susceptor (Step 1010). The susceptor is configured to provide a selected temperature for processing and crystalline growth.

Next, the method includes two or more processes to introduce precursor species and/or gases for formation of the gallium nitride epitaxial layer. In a specific embodiment, precursors species including at least a gallium bearing species, an indium bearing species, and a nitrogen bearing species are introduced into the reaction chamber (Step 1012) and initiate an epitaxial growth of a gallium indium nitride film material (Step 1014) overlying the exposed growth region. As an example, precursor gases include TMGa, TMIn, TEGa, TEIn, among others.

In a specific embodiment, the reaction chamber may be maintained at about atmospheric pressure for the growth of the gallium nitride film material. The reaction chamber may also be maintained at about 700 torr to no greater than 850 torr for the growth of the gallium nitride film material. Still, the reaction chamber may be maintained at about 1 Torr to about 760 Torr depending on the embodiment and preferably at about 760 Torr, which is substantially atmospheric. Other pressures may also exist in suitable combination with other process parameters.

In a preferred embodiment, the method maintains the temperature at about 600 Degree Celsius to about 1200 Degree Celsius for a period of time (Step 1016) while forming a crystalline indium gallium nitride material (Step 1018). In a specific embodiment, the crystalline gallium nitride is formed overlying the growth region. In a specific embodiment, the crystalline indium gallium nitride material is capable of emitting light at a wavelength ranging from about 400 nm to about 780 nm. In a preferred embodiment, the method maintains a reaction temperature of about 600 Degrees Celsius to about 1200 Degrees Celsius for the crystal material capable of emitting visible light. Preferably, the crystalline material has higher indium concentration compared to an indium concentration provided on a growth region that is larger, such as, for example, greater than about 15 microns. It is believed that two or more of the indium species diffuses at a faster rate than two or more of the gallium species to cause the higher indium concentration at the growth region using the smaller growth region. The indium concentration is characterized by about 20 to 50% molar concentration in a specific embodiment. In a specific embodiment, the indium concentration can range from about 30% to about 45% for 520 nanometer light emission. The indium gallium nitride film can also have an indium mole fraction ranging from about 1% to about 20% in the narrowest dimension of the growth region in a specific embodiment. The indium gallium nitride film can have an indium mole fraction in the ranging from about 20% to about 40% in the narrowest dimension of the growth region in an alternative embodiment. Yet in other embodiments, the indium gallium nitride film can have an indium mole fraction ranging from about 40% to about 60% in the narrowest dimension of the growth region or even up to about 60% to about 80% in the narrowest dimension of the growth region.

Other suitable processes for forming layers (e.g., quantum well, electrode) in optical devices are also included. As shown, the method stops with an end step (Step 1020).

The above sequence of steps provides a method of forming a crystalline indium gallium nitride film capable of emitting light in a wavelength range of 365 nm or 400 nm to 780 nm, but can be others. In a specific embodiment, the molar concentration of indium in the resulting crystalline indium gallium nitride material may vary (preferably higher) depending on a spatial width of the growth region thereby affecting the quality of the gallium material and the wavelength of the emitting light.

In a specific embodiment, a gallium containing crystalline material is provided. The gallium containing crystalline material includes a bulk non-polar gallium and indium containing crystalline material having a thickness of about 20 nanometers to about 1000 nanometers. In a specific embodiment, the thickness of the bulk non-polar gallium indium containing crystalline material is characterized by a spatial width dimension of no greater than about 10 microns. Depending on the embodiment, the spatial width dimension may be no greater than 7 microns or no greater than 4 microns or no greater than 2 micron. In a specific embodiment, the crystalline material has a photoluminescent characteristic of having a first wavelength. The first wavelength is at least five nanometers greater than a second wavelength. The second wavelength is derived from an indium and gallium containing crystalline material grown on a growth region of greater than about 15 microns.

In a specific embodiment, an optical device capable of emitting light is provided. The optical device includes a gallium containing substrate structure having a surface region. The optical device includes a region of insulating material having two or more growth regions provided on the surface region. The insulating material can be selected from silicon dioxide, silicon nitride, tantalum oxide, titanium oxide, zirconium oxide/zirconia, or zinc oxide, but can be others. The two or more growth regions are two or more exposed regions of the surface region in a specific embodiment. In a specific embodiment, the optical device includes a non-polar gallium indium containing crystalline material provided on a portion of two or more of the growth regions of the gallium containing substrate structure. The non-polar gallium indium containing crystalline material can have a thickness of about 1 nanometers to about 20 nanometers in a specific embodiment. A spatial width dimension of no greater than about 10 microns characterizes each of the two or more growth regions in a specific embodiment. The crystalline material has a first indium concentration characteristic. The first indium concentration characteristic is greater than a second indium concentration characteristic by at least about 1 percent in a specific embodiment. The second indium concentration characteristic is derived from an indium gallium containing crystalline material grown on a growth region of greater than about 15 microns in a specific embodiment.

Depending on the embodiment, the spatial width dimension of the growth region can be no greater than about 7 microns or no greater than about 4 microns or no greater than about 2 microns. In certain embodiments, the spatial width dimension is no greater than about 6 microns. Again depending on the embodiment, the first indium concentration can be characterized by about 20 to 50% molar concentration. As merely an example, the first indium concentration can range from about 30% to about 45% for a 520 nanometer light emission device.

Again, depending on the application, the optical device can have the two or more growth regions configured as two or more strips. Each of the strips is arranged in a parallel configuration relative to each other in a specific embodiment. Each of the strips can have a substantially similar width or different widths depending on the embodiment. In certain embodiments, at least one of the growth regions is configured with modulated widths having a first dimension and a second dimension. The first dimension can be the same as the second dimension. The first dimension can also be different from the second dimension in a specific embodiment.

The two or more growth regions may further include a plurality of growth regions. The plurality of growth regions can be arranged in an N by M array configuration to provide for a light emitting diode device, where N and M are integers greater than 1. The plurality of growth regions may also be configured with two or more spatial structures. The two or more spatial structures is selected from annular, trapezoidal, square, circular, polygon shaped, amorphous shaped, irregular shaped, triangular shaped, or any combinations of these, and others.

In a specific embodiment, the optical device is capable of emitting light in two or more of a plurality of selected wavelengths. The selected wavelengths range from about 480 to about 570 nanometer range depending on the spatial width dimension. Of course there can be other variations, modifications, and alternatives.

While the above is a full description of the specific embodiments, various modifications, alternative constructions and equivalents may be used. Further examples of selective epitaxial growth can be found in co-pending U.S. patent application Ser. No. 12/482,440, filed Jun. 10, 2009, commonly assigned, and hereby incorporated by reference in its entirety. Therefore, the above description and illustrations should not be taken as limiting the scope of the present invention which is defined by the appended claims.

CITED ART

The following journal articles are relevant to this document:

[1] M. Funato, M. Ueda, Y. Kawakami, Y. Narukawa, T. Kosugi, M. Takahashi, and T. Mukai, "Blue, Green, and Amber InGaN/GaN Light-Emitting Diodes on Semipolar {11-22} GaN Substrates," Journal of Japanese Applied Physics, Vol. 45, No. 26, pp. 659-662, 2006.

[2] C. Caneau, R, Bhat, M. R. Frei, C. C. Chang, R. J. Deri, and M. A. Koza, "Studies on Selective OMVPE of (Ga,In)/(As,P)," Journal of Crystal Growth. vol. 124 pp. 243-248. 1992.

[3] F. Bernardini, V. Fiorentini, and D. Vanderbilt, "Spontaneous polarization and piezoelectric constants of III-V nitrides," Physical Review B, Vol. 56, No. 16, pp. 1002410027, October 1997.

[4] P. Waltereit, O. Brandt, A. Trampert, H. Grahn, J. Menniger, M. Ramsteiner, M. Reiche, and K. Ploog, "Nitride semiconductors free of electrostatic fields for efficient white light-emitting diodes," Nature, Vol. 406, pp. 865-868, August 2000.

[5] M. Schmidt, K. C. Kim, R. M. Farrell, D. F. Feezell, D. A. Cohen, M. Saito, K. Fujito, J. S. Speck, S. P. DenBaars, and S. Nakamura, "Demonstration of Nonpolar m-plane InGaN/GaN Laser Diodes," Journal of Japanese Applied Physics, Vol. 46, No. 9, pp. 190191, 2007.

[6] K. Okamoto, T. Tanaka, M. Kubota, and H. Ohta, "Pure Blue Laser Diodes Based on Nonpolar m-Plane Gallium Nitride with InGaN Waveguiding Layers," Journal of Japanese Applied Physics, Vol. 46, No. 35, pp. 820-822, 2007.

[7] H. Sato, A. Tyagi, H. Zhong, N. Fellows, R. B. Chung, M. Saito, K. Fujito, J. S. Speck, S. P. DenBaars, and S. Nakamura "High power and high efficiency green light emitting diode on free-standing semipolar (11-22) bulk GaN substrate" Phys. Stat. Sol, Vol. 1, no. 4, pp. 162-164, 2007.

[7] S. Nakamura, M. Senoh, S. Nagahama, N. Iwasa, T. Yamada, T. Matsushita, H. Kiyoku, Y. Sugimoto, T. Kozaki, H. Umemoto, M. Sano, and K. Chocho, "InGaN/Gan/AlGaN-based laser diodes with modulation-doped strained-layer superlattices grown on an epitaxially laterally grown GaN substrate", Applied Physics Lefts., Vol. 72, No. 12, pp. 211-213, Jan. 12, 1998.

[9] T. Asano, T. Tsuyoshi, T. Mizuno, M. Takeya, S. Ikeda, K. Shibuya, T. Hino, S. Uchida, and M. Ikeda, "100-mW kink-free blue-violet laser diodes with low aspect ratio," IEEE Journal of Quantum Electronics, Vol. 39, No. 1, pp. 135-140, January 2003.

[10] S. Uchida, M. Takeya, S. Ikeda, T. Mizuno, T. Fujimoto, O. Matsumoto, S. Goto, T. Tojyo, and M. Ikeda, "Recent progress in high-power blue-violet lasers," IEEE Journal of Selected Topics in Quantum Electronics, Vol. 9, No. 5, pp. 1252-1259, September/October 2003.

[11] hap ://techon.nikkeibp. co jp/english/NEWS_EN/20080122/146009/

[12] O. H. Nam, T. S. Zheleva, M. D. Bremser, and R. F. Davis, "Later epitaxial overgrowth of GaN films on SiO2 areas via metalorganic vapor phase epitaxy," Journal of Electronic Materials, Vol. 27, No. 4, pp. 233-237, April 1998.

[13] M. Kuramoto, A. Kimura, C. Sasaoka, T. Arakida, M. Nido, and M. Mizuta, "Novel Ridge-Type InGaN Multiple-Quantum-Well Laser Diodes Fabricated by Selective Area Re-Growth on n-GaN Substrates," Journal of Japanese Applied Physics, Vol. 40, pp. 925-927, September 2007.

[14] P. Chen, A. Chen, S. Jin Chua, and J. N. Tan, "Growth and Optical Properties of Highly Uniform and Periodic InGaN Nanostructures," Advanced Materials, Vol. 19, pp. 1707-1710, 2007.

[15] H. Yu, T. Jung, L. K. Lee, and P. C. Ku, "Multiple Wavelength Emission from Semipolar InGaN/GaN Quantum Wells Selectively Grown by MOCVD."

[16] M. Funato, T. Kondou, K. Hayashi, S. Nishiura, M. Ueda, Y. Kawakami, Y. Narukawa, and T. Mukai, "Monolithic Polychromatic Light-Emitting Diodes Based on InGaN Microfacet Quantum Wells toward Tailor-Made Solid-State Lighting," Applied Physics Lefts., Vol. 1, 2008.

[17] M. Aoki, M. Suzuki, H. Sano, T. Kawano, T. Ido, T. Taniwatari, K. Uomi, and A. Takai, "InGaAs/InGaAsP MQW Electroabsorption Modulator Integrated with a DFB Laser Fabricated by Band-Gap Energy Control Selective Area MOCVD," IEEE J Quantum Electron., vol. 29, pp. 2088-2096, 1993.

What is claimed is:
1. An optical device capable of emitting electromagnetic radiation at a wavelength of at least about 365 nanometers comprising:
a gallium and nitrogen containing substrate having a surface, wherein the surface is characterized by a semipolar crystallographic orientation;
an n-type semipolar gallium and nitrogen containing layer overlying the surface;
a dielectric material layer overlying the n-type semipolar gallium and nitrogen containing layer, wherein the dielectric material layer defines one or more growth regions, wherein the one or more growth regions is characterized by a maximum dimension no larger than ten microns;

an n-type semipolar gallium and nitrogen containing material overlying each of the one or more growth regions; and a light emitting active region overlying the n-type semipolar gallium and nitrogen containing material overlying at least one of the one or more growth regions, wherein the light emitting active region comprises a semipolar gallium, nitrogen, and indium containing material, and wherein the light emitting active region is characterized by an indium mole fraction from about 20% to about 60%.

2. The device of claim 1, wherein the n-type semipolar gallium and nitrogen containing material comprises an n-type gallium, nitrogen, and indium containing material.

3. The device of claim 1, wherein the light emitting active region is characterized by an indium mole fraction from about 30% to about 45%.

4. The device of claim 1, wherein the one or more growth regions is characterized by a rectangular shape.

5. The device of claim 1, wherein the dielectric material layer comprises a material selected from silicon dioxide, silicon nitride, tantalum oxide, titanium oxide, zirconium oxide, and zinc oxide.

6. The device of claim 1, wherein,
the dielectric material layer is characterized by a first thickness;
the n-type gallium and nitrogen containing material overlying each of the more or more growth regions is characterized by a second thickness; and
the second thickness is less than the first thickness.

7. The device of claim 1, wherein,
the dielectric material layer is characterized by a first thickness;
the n-type gallium and nitrogen containing material overlying each of the more or more growth regions is characterized by a second thickness; and
the second thickness is about the same as the first thickness.

8. The device of claim 1, wherein a portion of the light emitting active region is below an upper surface of the dielectric material layer.

9. The device of claim 1, wherein a portion of the light emitting active region overlies a portion of the dielectric material layer.

10. The device of claim 1, comprising a p-type gallium and nitrogen containing layer overlying the light emitting active region.

11. The device of claim 1, comprising a p-type gallium and nitrogen containing layer overlying the light emitting active region and the dielectric material layer.

12. The device of claim 1, wherein the optical device comprises a light emitting diode.

13. The optical device of claim 1, wherein the one or more growth regions is configured in an N by M configuration, wherein each of N and M is an integer greater than 1.

14. The optical device of claim 1, wherein the one or more growth region is characterized by a maximum dimension no larger than four microns.

15. The optical device of claim 1, wherein the light emitting active region is characterized by an indium mole fraction from about 20% to about 50%.

16. The optical device of claim 1, wherein the light emitting active region is characterized by an indium mole fraction from about 40% to about 60%.

17. The optical device of claim 1, wherein the light emitting active region is configured parallel to the substrate surface.

18. A multi-colored optical device capable of emitting electromagnetic radiation with a characteristic wavelength of at least about 365 nanometers comprising:

a gallium and nitrogen containing substrate having a surface, wherein the surface is characterized by a nonpolar crystallographic orientation;

an n-type nonpolar gallium and nitrogen containing layer overlying the surface;

a dielectric material layer overlying the n-type nonpolar gallium and nitrogen containing layer, wherein the dielectric material layer defines one or more growth regions, wherein the one or more growth regions is characterized by a maximum dimension no larger than ten microns;

an n-type nonpolar gallium and nitrogen containing material overlying each of the one or more growth regions; and a light emitting active region overlying the n-type nonpolar gallium and nitrogen containing material overlying at least one of the one or more growth regions, wherein the light emitting active region comprises a nonpolar gallium, nitrogen, and indium containing material, and wherein the light emitting active region is characterized by an indium mole fraction from about 20% to about 60%.

19. The device of claim 18 wherein the maximum dimension is no larger than two microns.

20. The device of claim 18, wherein the one or more growth regions is characterized by a rectangular shape.

21. The device of claim 18 wherein the dielectric material layer comprises a material selected from silicon dioxide, silicon nitride, tantalum oxide, titanium oxide, zirconium oxide, and zinc oxide.

* * * * *